United States Patent
Abe

[11] Patent Number: 5,585,684
[45] Date of Patent: Dec. 17, 1996

[54] SURFACE ACOUSTIC WAVE DEVICE

[75] Inventor: Hidenori Abe, Toda, Japan

[73] Assignee: Japan Energy Corporation, Toda, Japan

[21] Appl. No.: 567,805

[22] Filed: Dec. 6, 1995

Related U.S. Application Data

[63] Continuation of Ser. No. 286,466, Aug. 5, 1994, abandoned.

[30] Foreign Application Priority Data

Aug. 6, 1993 [JP] Japan .................................. 5-213506
Aug. 6, 1993 [JP] Japan .................................. 5-213507

[51] Int. Cl.$^6$ .................................................. H01L 41/08
[52] U.S. Cl. ............................ 310/313 A; 310/313 B; 310/313 D
[58] Field of Search .......................... 310/313 R, 313 A, 310/313 B, 313 C, 313 D; 333/150–155, 193–196

[56] References Cited

U.S. PATENT DOCUMENTS

| | | | |
|---|---|---|---|
| 4,672,255 | 6/1987 | Suzuki et al. | 310/313 A |
| 5,302,877 | 4/1994 | Sato et al. | 310/313 A |
| 5,434,465 | 7/1995 | Sato et al. | 310/313 A |

FOREIGN PATENT DOCUMENTS

| | | |
|---|---|---|
| 58-3307 | 1/1983 | Japan . |
| 61-285814 | 12/1986 | Japan . |
| 3296316 | 12/1991 | Japan . |

OTHER PUBLICATIONS

"SAW Resonator and Resonator Filter On $Li_2B_4O_7$ Substrate", Yasuo Ebata, et al., Proceedings of 7th Symposium and Ultrasonic Electronics, Kyoto 1986, 2419 Japanese Journal of Applied Physics/Supplement 26 (1987) Suppl. 26–1, Tokyo, Japan.

*Primary Examiner*—Mark O. Budd
*Attorney, Agent, or Firm*—Dickstein Shapiro Morin & Oshinsky LLP

[57] ABSTRACT

A surface acoustic wave device comprises, on a lithium tetraborate substrate 10, a central interdigital transducer 21, 31, and first and second interdigital transducers 22, 23, 32, 33 disposed adjacently on both sides of the central interdigital transducer 21, 31 in a propagation direction of surface acoustic waves, or comprises a first such row of transducers 20 and a second such row of transducers 30 connected in cascade to each other. A sum Nc+Ns of a number of the central interdigital transducer pairs Nc, and a total number of the first and second interdigital transducers pairs Ns is set at a suitable range. The surface acoustic wave device has flat group delay times, relatively wide specific band widths, small insertion losses and large attenuation outside the pass band.

20 Claims, 27 Drawing Sheets

SURFACE ACOUSTIC WAVE DEVICE

This application is a continuation of application Ser. No. 08/286,466 filed Aug. 5, 1994, now abandoned.

BACKGROUND OF THE INVENTION

The present invention relates to a device structure of surface acoustic wave devices used as filters of mobile communication devices, etc.

Filters in the form of surface acoustic wave devices are widely used in communication apparatus, broadcasting apparatus, measuring apparatus, etc. because of their small-size, lightness, and high performance. Conventionally severe narrow-band characteristics, and additionally small temperature changes at center frequencies and severe attenuation characteristics outside the pass band are required of intermediate frequency filters used in analog communication systems. In such applications transversal surface acoustic wave filters, etc. having 0.03–0.1% of a 3 dB specific band width (hereinafter called specific band width) on ST cut crystal substrates are used.

In mobile communication, etc., replacement of analog communication systems by digital communication system is being studied for more efficient uses of frequencies and privacy communications. Relatively wide specific band width as wide as 0.3–0.5%, flat group delay times, and attenuation characteristics outside the pass band whose values exceed those of the analog communication system are required of intermediate frequency filters used in a digital communication system. Portable apparatus for mobile communication must be smaller-sized, and the surface acoustic wave filters must be accordingly smaller-sized and have smaller insertion losses.

The conventional transversal surface acoustic wave filter including two interdigital transducers has an advantage that a required amplitude characteristic and a phase characteristic can be designed independently from each other. But a disadvantage of the transversal surface acoustic filter is large insertion losses, and to obtain a 0.3–0.5% band width, a number of finger electrodes are necessary, which makes the device large-sized and its attenuation outside the pass band insufficient.

A known structure of filters with low losses and wide bands includes three interdigital transducers each having four pairs of finger electrodes neighboring on a $LiNbO_3$ substrate. Its insertion loss is 10 dB, and a specific band width is 20% (M. F. Lewis, Electron Letters, vol. 8, no. 23, p. 553 (1972). But too large insertion loss and specific band width are disadvantages of this filter.

On the other hand, known small-sized surface acoustic wave filters with small losses include resonator filters and multi-electrodes interdigital transducer filters. These filters have structures which have been merely determined in consideration of insertion losses and attenuation outside the pass band, and have failed to have required group delay time characteristics. For example, a filter having three interdigital transducers each having 700 pairs of finger electrodes has a 5 dB insertion loss, and a 0.02% specific band width (Yamada, Yoshikawa, Ishihara, Report of Institute of Japan Electronics and Communication Engineers, vol. J60-A, no. 9, pp. 805 (1977)). But its group delay time characteristic and amplitude ripple in pass band are unknown. Its specific band width is narrow.

As described above, the surface acoustic wave filter of the conventional structure can not attain relatively wide specific band widths, large attenuation outside the pass band, small-sizes and low insertion losses, and additionally flat group delay time characteristics.

SUMMARY OF THE INVENTION

The present invention has solved the above-described problems, and an object of the present invention is to provide a surface acoustic wave filter having flat group delay times, relatively wide specific band widths, low insertion losses, and large attenuation outside the pass band.

To fabricate a surface acoustic wave filter satisfying the above-described characteristics, single crystal lithium tetraborate substrate, which is a new material having good temperature characteristics and an about 1% electromechanical coupling factor, is used as a piezoelectric substrate. In the surface acoustic wave filter, three interdigital transducers with a number of pairs of finger electrodes are formed adjacent to each other on the single crystal lithium tetraborate substrate in a propagation direction of surface acoustic waves, whereby reflection of surface acoustic waves on the fingers electrodes of these interdigital transducers are used. For this surface acoustic wave filter, amplitude characteristics such as specific band widths, and group delay time characteristics, can not be designed independently from each other. No electrode configuration which satisfies required values of both characteristics has been known. In addition, spurious peaks occur in the frequency region outside a pass band, and the attenuation outside the pass band is unsatisfactory.

In view of these, the inventor studied in detail the influences of a number of an interdigital transducer (IDT) pairs, electrode film thicknesses so as to obtain electric characteristics whose specific band width is above 0.3%, and which have small amplitude ripples, small group delay time ripples and small insertion losses in the pass band, and small spurious peaks outside the pass band.

A surface acoustic wave device according to the present invention, comprises a lithium tetraborate substrate; and a row of transducers including a central interdigital transducer disposed on the substrate, and a first interdigital transducer and a second transducer disposed on both sides of the central transducer adjacent thereto; a sum Nc+Ns of a number of the central interdigital transducer pairs Nc, and a total number of the first and the second interdigital transducers pairs Ns satisfying the following formula $$110-3000H/\lambda \leq Nc+Ns \leq 320-3000H/\lambda$$

where H/λ is a normalized film thickness, namely a film thickness H of the interdigital transducers normalized by a period λ of the interdigital transducers.

Especially, it is preferable that the sum Nc+Ns of the numbers satisfies the following formula $$160-3000H/\lambda \leq Nc+Ns \leq 260-3000H/\lambda$$

It is preferable that a surface acoustic wave device comprises a first row of transducers as described above, and a second row of transducers as described above, the second row of transducers being connected in cascade to the first row of transducers. The connection between the first row of transducers and the second row of transducers can have the following three forms.

In a first connection form, the central interdigital transducer of the first row of transducers, and the first and the second interdigital transducers of the second row of transducers are respectively connected to an input terminal and an output terminal, the first and the second interdigital transducers of the first row of transducers are connected to the central interdigital transducer of the second row of transducers, a sum Nc+Ns of a number of the central interdigital transducer pairs Nc, and a total number of the first and the second interdigital transducers pairs Ns of each row satisfying the following formula $$210-6000H/\lambda \leq Nc+Ns \leq 320-3000H/\lambda.$$

Especially, it is preferable that the sum Nc+Ns of the numbers of each row satisfies the following formula $$220-6000H/\lambda \leq Nc+Ns \leq 320-6000H/\lambda.$$

In a second connection form, the central interdigital transducer of the first row of transducers, and the central interdigital transducer of the second row of transducers are respectively connected to an input terminal and an output terminal; the first and the second interdigital transducers of the first row of transducers, and the first and the second interdigital transducers of the second row of transducers are connected to each other; a sum Nc+Ns of a number of the central interdigital transducer pairs Nc, and a total number of the first and the second interdigital transducers pairs Ns of each row satisfying the following formula $$140-3000H/\lambda \leq Nc+Ns \leq 270-3000H/\lambda.$$

Especially, it is preferable that the sum Nc+Ns of the numbers of each row satisfies the following formula $$150-3000H/\lambda \leq Nc+Ns \leq 260-3000H/\lambda.$$

In a third connection form, the first and the second interdigital transducers of the first row of transducers, and the first and the second interdigital transducers of the second row of transducers are respectively connected to an input terminal and an output terminal; the central interdigital transducers of the first row of transducers, and the central interdigital transducers of the second row of transducers are connected to each other; a sum Nc+Ns of a number of the central interdigital transducer pairs Nc, and a total number of the first and the second interdigital transducers pairs Ns of each row satisfies the following formula $$160-3000H/\lambda \leq Nc+Ns \leq 310-3000H/\lambda.$$

Especially, it is preferable that the sum Nc+Ns of the numbers of each row satisfies the following formula $$170-3000H/\lambda \leq Nc+Ns \leq 310-6000H/\lambda.$$

In the above-described surface acoustic wave device according to the present invention, it is preferable that a ratio Ns/Nc of a total number of the first and the second interdigital transducers pairs Ns to a number of the central interdigital transducer pairs Nc satisfies the following formula $$1.0 \leq Ns/Nc \leq 1.6 \text{ or } 2.5 \leq Ns/Nc \leq 3.1.$$

In the above-described surface acoustic wave device according to the present invention, it is preferable that in each row of transducers, a distance Li between a center of an outermost finger electrode of the central interdigital transducer and a center of a outermost finger electrode of the first or the second interdigital transducers satisfies the following formula $$0.40\lambda+n\lambda \leq Li \leq 0.54\lambda+n\lambda$$

where n is a positive integer or zero.

Especially, it is preferable that the distance Li between the centers of the finger electrodes satisfies the following formula $$0.43\lambda+n\lambda \leq Li \leq 0.47\lambda+n\lambda.$$

In the above-described surface acoustic wave device according to the present invention, it is preferable that a metallization ratio which indicates a ratio of the substrate occupied by the finger electrodes of the interdigital transducers in a propagation direction of surface acoustic waves is above 0.50 and below 0.75.

In the above-described surface acoustic wave device according to the present invention, it is preferable that the interdigital transducers are formed of aluminium as a main component; and the normalized film thickness is above 0.005 (0.5%) and below 0.03 (3%).

In the above-described surface acoustic wave device according to the present invention, it is preferable that a cut angle of the substrate and a propagation direction of surface acoustic waves are in an Eulerian angle representation of (0°–45°, 90°±10°, 90°±10°) and directions equivalent thereto.

Especially, it is preferable that a cut angle of the substrate and a propagation direction of surface acoustic waves are in an Eulerian angle representation of (45°±5°, 90°±5°, 90°±5°) and directions equivalent thereto. Electric characteristics changes due to ambient temperature then decrease, thus this improves the temperature characteristics of the surface acoustic wave device.

An aperture length of the interdigital transducers is so set that an input/output impedance of the surface acoustic wave device agrees with an outside terminal impedance.

DETAILED DESCRIPTION OF THE INVENTION

Figure 1:
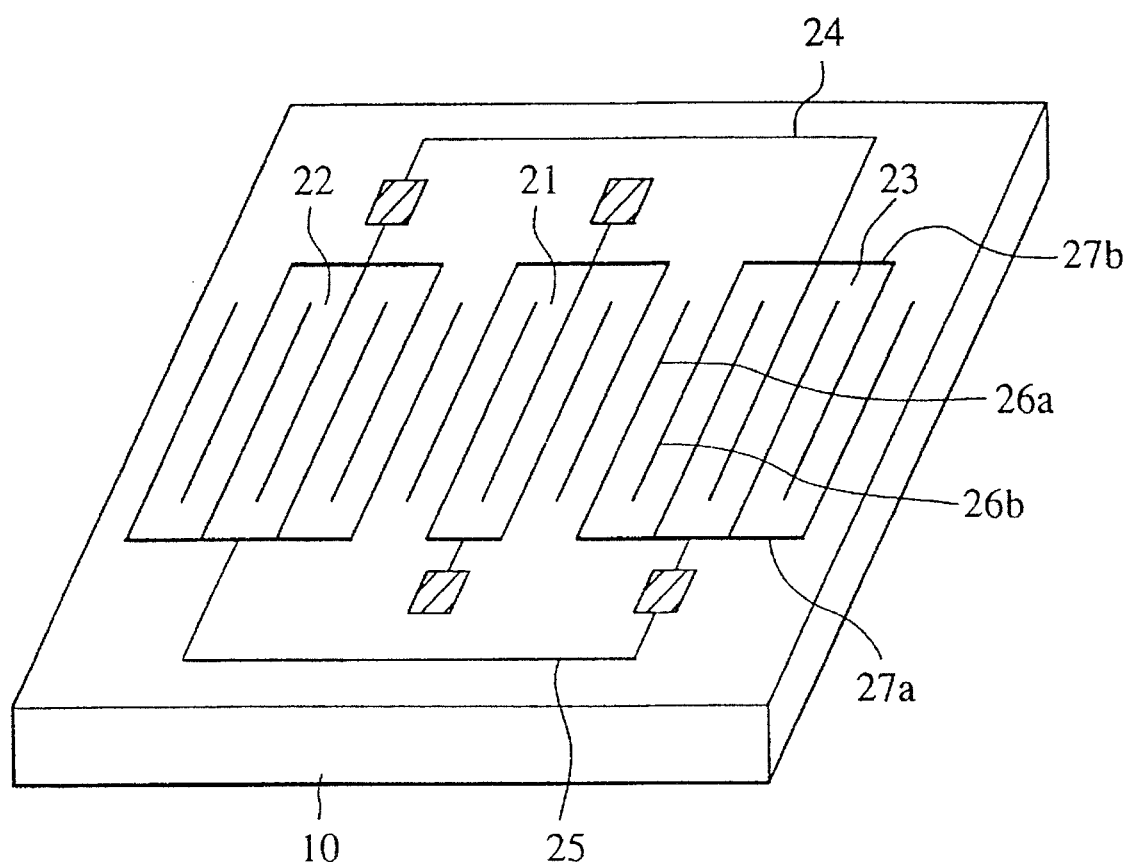
FIG. 1 is a view of a first embodiment of the transducer structure of the surface acoustic wave device according to the present invention.

A first embodiment of the transducer arrangement of the surface acoustic wave device according to the present invention is schematically shown in FIG. 1. A central interdigital transducer 21 is disposed at the center of the surface of a piezoelectric substrate 10 of lithium tetraborate, and a first and a second interdigital transducers 22, 23 are disposed on both sides of the central interdigital transducer 21. The first and second interdigital transducer electrodes are connected in parallel by wires 24, 25. The respective interdigital transducers 21, 22, 23 each include two sets of finger electrodes 26a, 26b which are alternately arranged in an interdigitated manner, comparable to the interlocking fingers of a pair of hands, and a bus bar 27a, 27b interconnecting the finger electrodes 26a, 26b at the ends thereof. The finger electrodes 26a, 26b extend perpendicularly to a propagation direction of surface acoustic waves, and the bus bars 27a, 27b extend substantially parallel to the propagation direction of surface acoustic waves. The finger electrodes of the interdigital electrodes 21, 22, 23 are formed of aluminium. The parallel connecting wires 24, 25 may be disposed outside the substrate 10.

Figure 5:
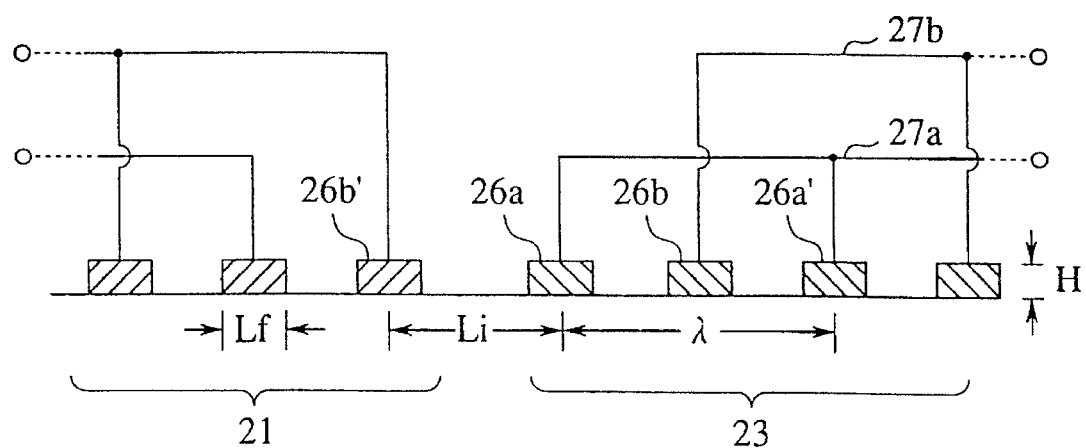
FIG. 5 is a sectional view of the first embodiment of the transducer structure of the surface acoustic wave device according to the present invention.

FIG. 5 is a sectional view of the central and the second interdigital transducers 21, 23 of the surface acoustic wave device according to the present invention at portions thereof adjacent to each other along a propagation direction of surface acoustic waves.

A period $\lambda$ of the interdigital transducers 21, 23 is defined as a distance between one finger electrode 26a and adjacent one 26a' of the same set of finger electrodes 26a, usually a distance between the center of the finger electrode 26a and that of the finger electrode 26a'.

A pair number of each interdigital transducer (IDT) is given by counting a pair of one finger electrode 26a and one finger electrode 26b which are adjacent to each other, and one finger electrode 26a, 26b which is not paired is counted as 0.5 pair.

A gap Li between the IDTs is defined by a distance Li between the centers of adjacent outermost finger electrodes 26b', 26a of the IDTs 21, 23. An IDT gap Li may be Li+n$\lambda$ where n is a positive integer or zero.

A metallization ratio which indicates a ratio of the substrate occupied by one finger electrode of each interdigital transducer in a propagation direction of surface acoustic waves is represented by a finger electrode width Lf and is defined as 2×Lf/$\lambda$.

In the above-described electrode arrangement, a specific band width, an amplitude ripple and a group delay time ripple are given by numerical simulations with a total number of IDT pairs, i.e., a sum Nc+Ns of a number of the central interdigital transducer pairs Nc, and a total number of the first and the second interdigital transducers pairs Ns varied. TABLE 1 shows the conditions for the simulations. FIGS. 6 to 9 show the results of the simulations. In FIGS. 6 to 9, a specific band width is represented by $\Delta$; an amplitude ripple, by $\nabla$; and a group delay time ripple, by . A ratio of IDT pairs Ns/Nc is a ratio of a total number of the first and the second interdigital transducers pairs Ns to a number of the central interdigital transducer pairs Nc.

TABLE 1

Figure 6:
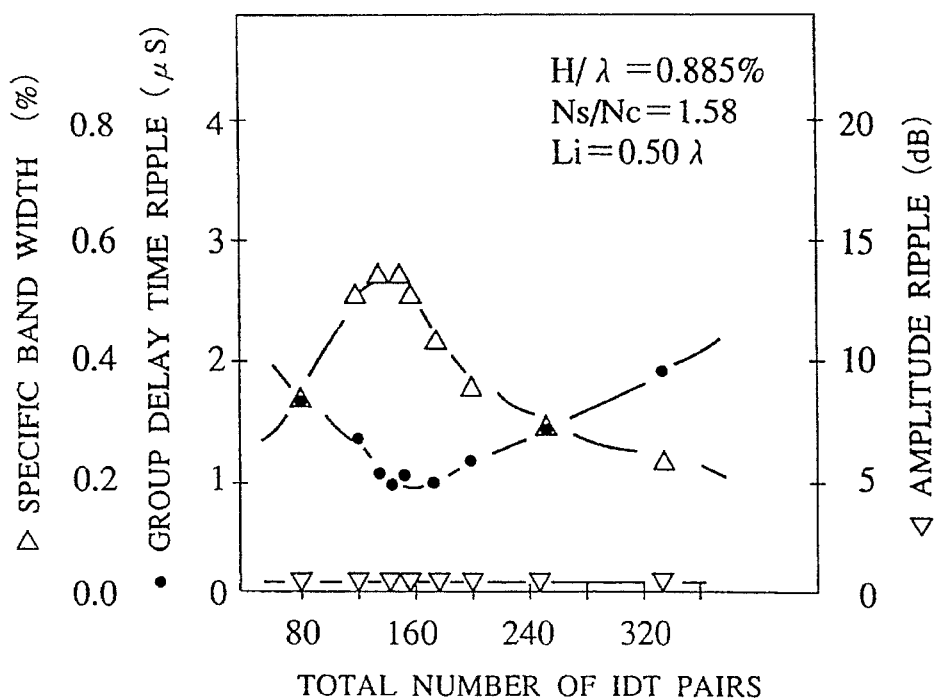
FIG. 6 is a graph of numerical simulation results with the total number of IDT pairs varied in the first embodiment of the transducer structure of the surface acoustic wave device according to the present invention.
Figure 7:
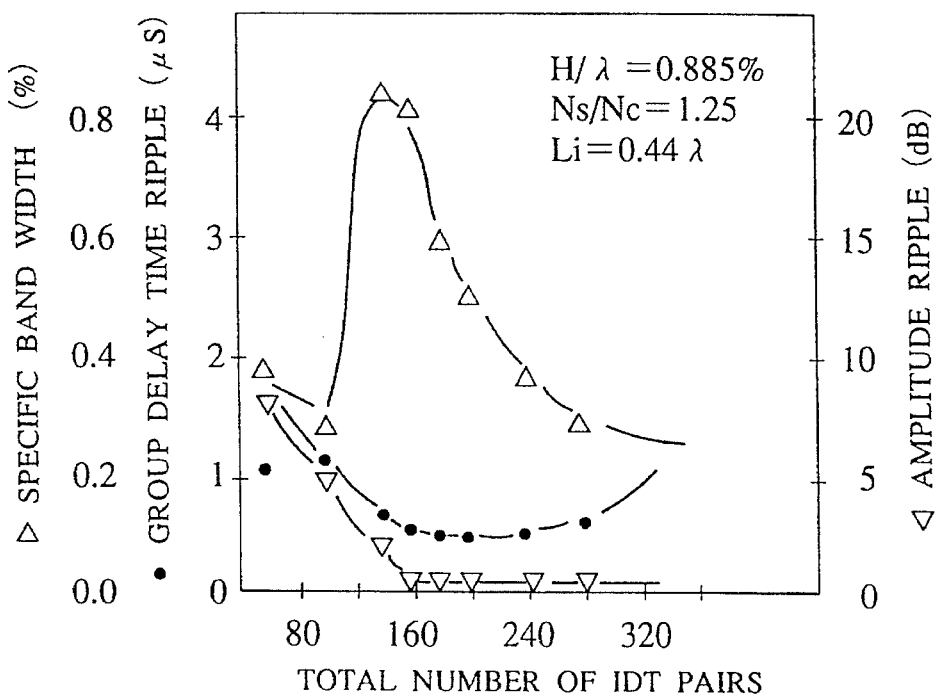
FIG. 7 is a graph of numerical simulation results with the total number of IDT pairs varied in the first embodiment of the transducer structure of the surface acoustic wave device according to the present invention.
Figure 8:
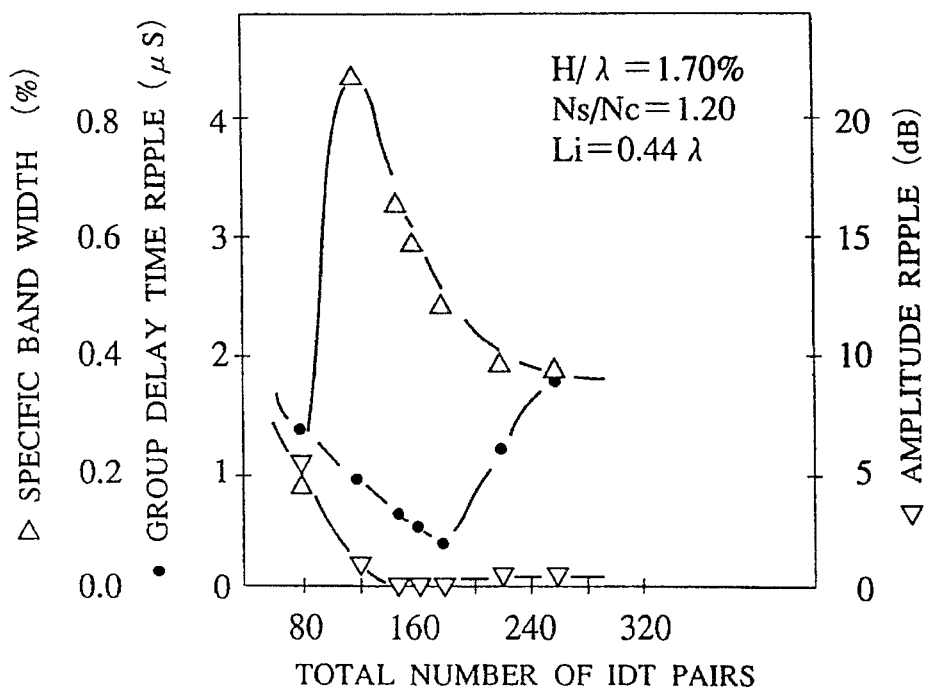
FIG. 8 is a graph of numerical simulation results with the total number of IDT pairs varied in the first embodiment of the transducer structure of the surface acoustic wave device according to the present invention.
Figure 9:
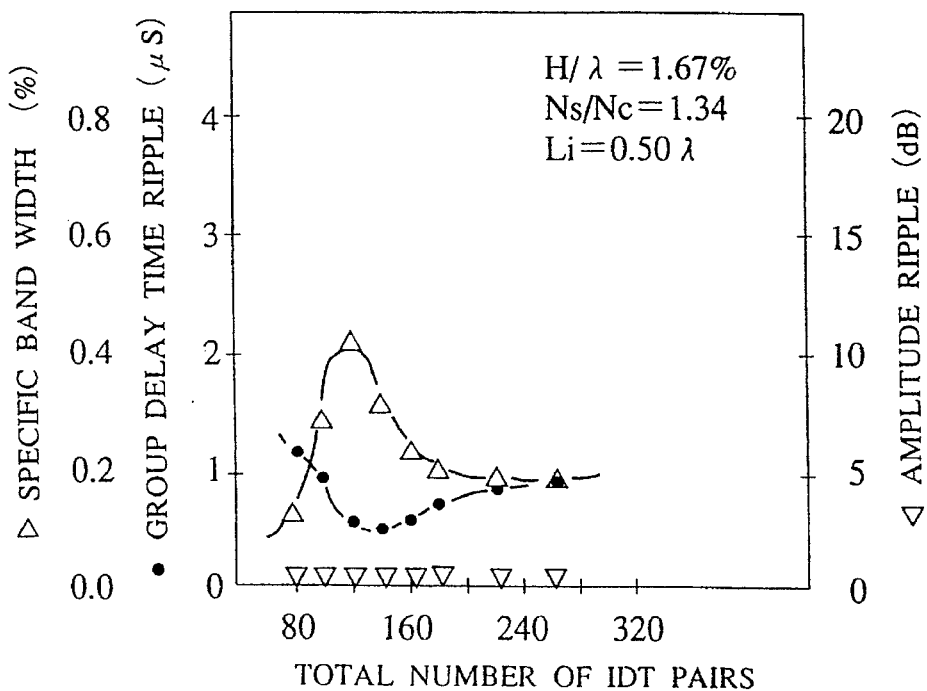
FIG. 9 is a graph of numerical simulation results with the total number of IDT pairs varied in the first embodiment of the transducer structure of the surface acoustic wave device according to the present invention.

|  | Normalized film thickness H/$\lambda$(%) | Ratio of IDT pairs Ns/Nc | IDT gap Li ($\lambda$) |
| --- | --- | --- | --- |
| FIG. 6 | 0.885 | 1.58 | 0.50 |
| FIG. 7 | 0.885 | 1.25 | 0.44 |
| FIG. 8 | 1.70 | 1.20 | 0.44 |
| FIG. 9 | 1.67 | 1.34 | 0.50 |

FIGS. 6 to 9 show that to obtain an above 0.3% specific band width, a below 6 dB amplitude ripple, and a below 1.5 $\mu$S group delay time ripple, a total number Ns+Nc is set at a range of 90–280 pairs for an about 0.9% normalized film thickness and at 90–240 pairs for an about 1.7% normalized film thickness.

It is also shown that to obtain an above 0.4% specific band width, a below 3 dB amplitude ripple, and a below 1.0 $\mu$S group delay time ripple, a total number Nc+Ns is set at a range of 120–240 pairs for an about 0.9% normalized film thickness and at 110–210 pairs for an about 1.7% normalized film thickness.

It is preferable that an IDT gap is 0.40–0.55 $\lambda$. Especially an about 0.44 $\lambda$ IDT gap results in a wider specific band width, or smaller delay time ripples.

Figure 10:
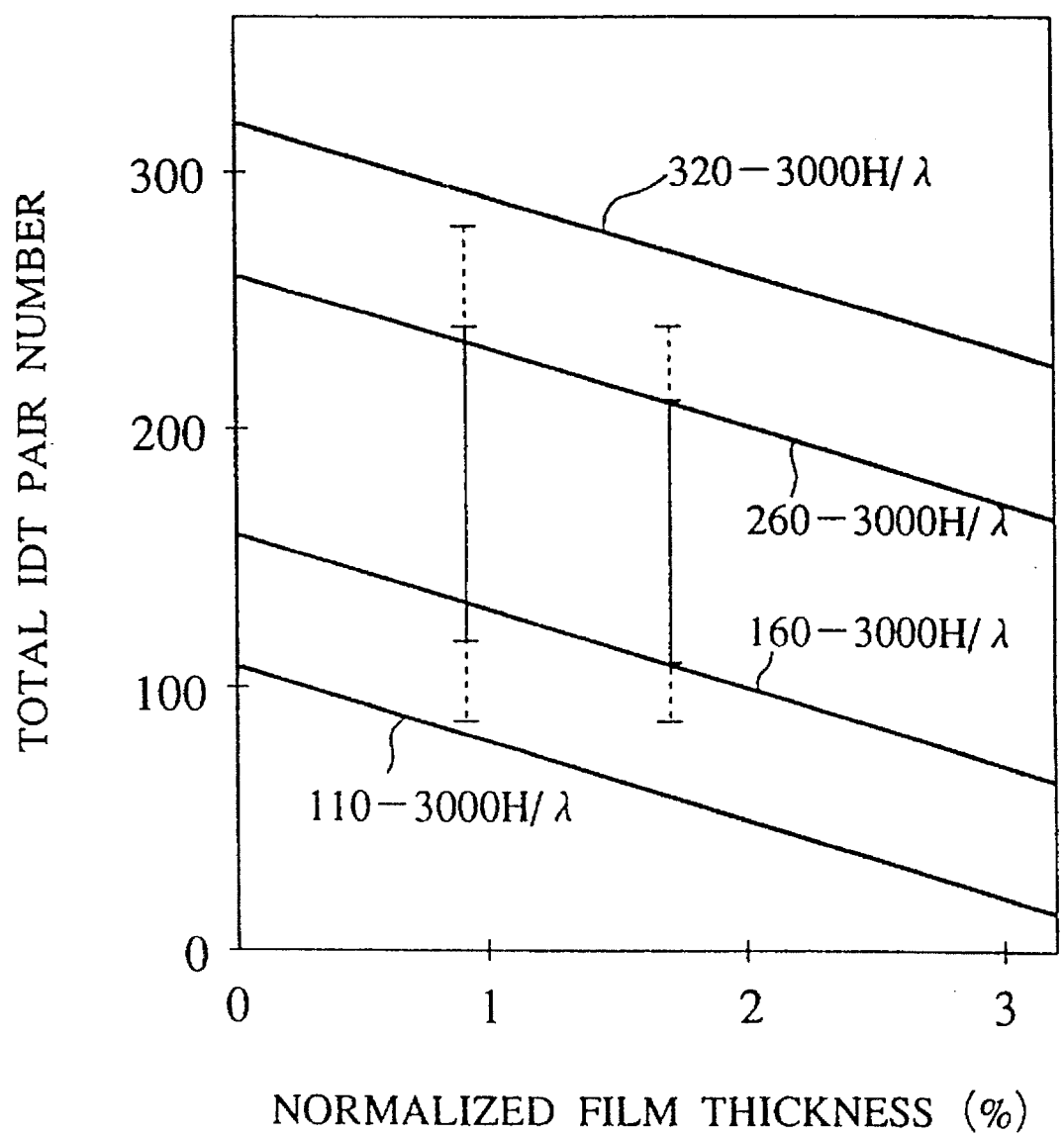
FIG. 10 is a graph of relationships between suitable total numbers of IDT pairs Nc+Ns and normalized film thicknesses H/λ of the surface acoustic wave device according to the present invention.

The above-described suitable ranges are shown in relationships between the total number of IDT pairs Nc+Ns and the normalized film thickness H/$\lambda$ in FIG. 10. A suitable total number Nc+Ns range is indicated by the broken line, and a preferable total number Nc+Ns is indicated by the solid line.

As shown in the relationships, a total number of IDT pairs Nc+Ns satisfies the following formula $$110-3000H/\lambda \leq Nc+Ns \leq 320-3000H/\lambda.$$

Especially a total number of IDT pairs Nc+Ns preferably satisfies the following formula $$160-3000H/\lambda \leq Nc+Ns \leq 260-3000H/\lambda.$$

Then a second embodiment (FIGS. 2, 3 and. 4) of the transducer arrangement of the surface acoustic wave apparatus according to the present invention is studied. This embodiment includes a first row and a second row of transducers 20, 30 of the same structure as those of the first embodiment formed on a lithium tetraborate substrate 10, and the first and the second rows of transducers are connected in cascade to each other.

The first row of transducers 20 includes a central interdigital transducer 21, and a first and a second interdigital transducers 22, 23 sandwiching the central interdigital transducer 21. The respective interdigital transducers 21, 22, 23 each comprises two sets of finger electrodes 26a, 26b which are alternately arranged in an interdigitated manner, and are electrically interconnected at the ends thereof respectively by bus bars 27a, 27b. The finger electrodes 26a, 26b extend substantially perpendicularly to a propagation direction of surface acoustic waves. The bus bars 27a, 27b extend substantially parallel to the propagation direction of surface acoustic waves.

The second row of transducers has the same structure as the first row of transducers. There is provided a central interdigital transducer 31, and first and second interdigital transducers 32, 33 sandwich the central interdigital transducer 31. The interdigital transducers each comprise two sets of finger electrodes 36a, 36b, and bus bars 37a, 37b electrically interconnecting the respective finger electrodes 36a, 36b at the ends thereof. The finger electrodes 36a, 36b extend substantially perpendicularly to a propagation direction of surface acoustic waves. The bus bars 37a, 37b extend substantially parallel to the propagation direction of surface acoustic waves.

Figure 2:
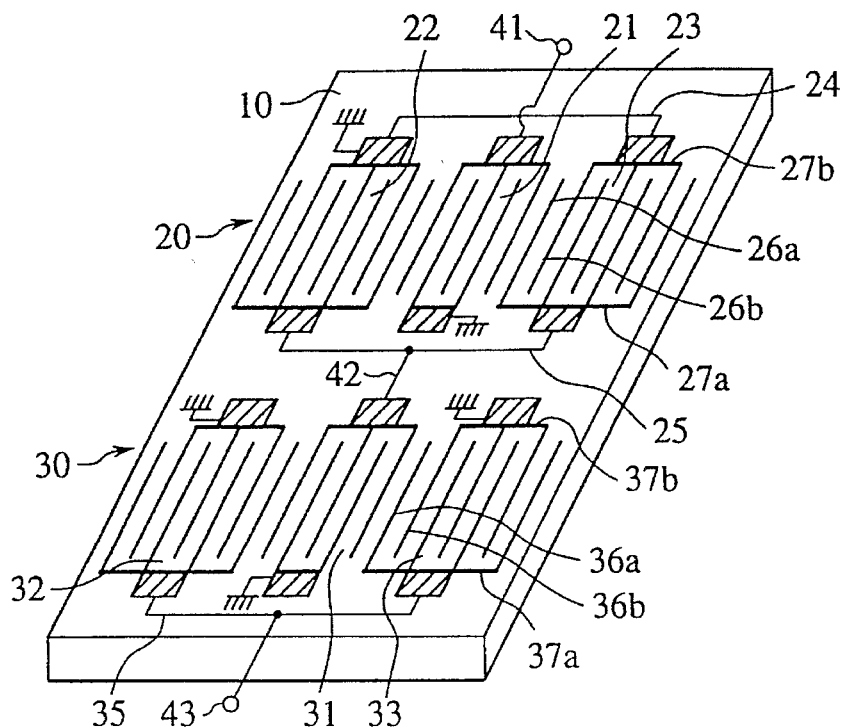
FIG. 2 is a view of a second embodiment of the transducer structure of the surface acoustic wave device according to the present invention, which is in a first connection form.
Figure 3:
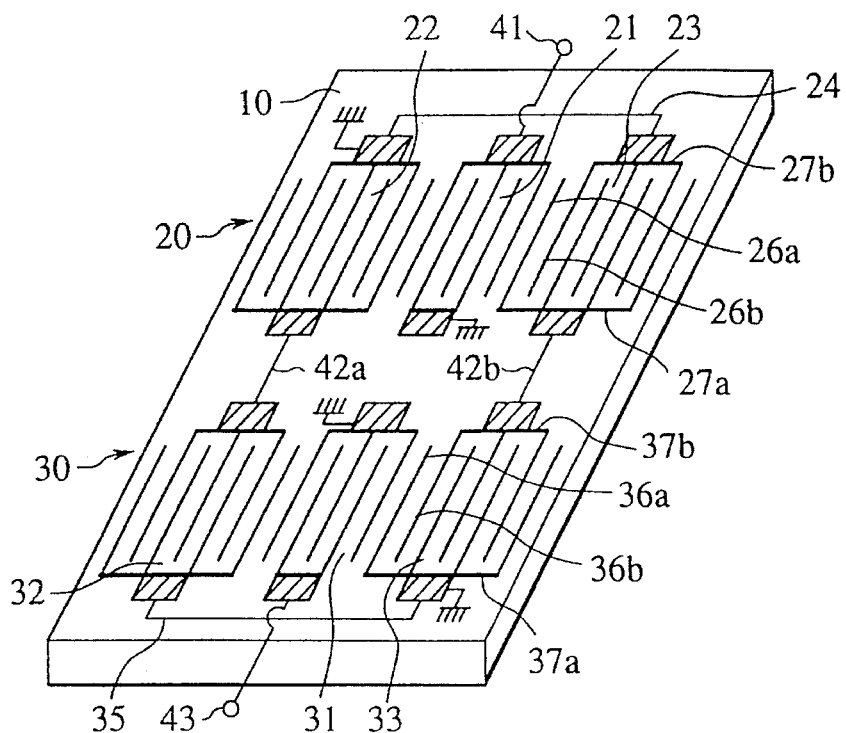
FIG. 3 is a view of the second embodiment of the transducer structure of the surface acoustic wave device according to the present invention, which is in a second connection form.
Figure 4:
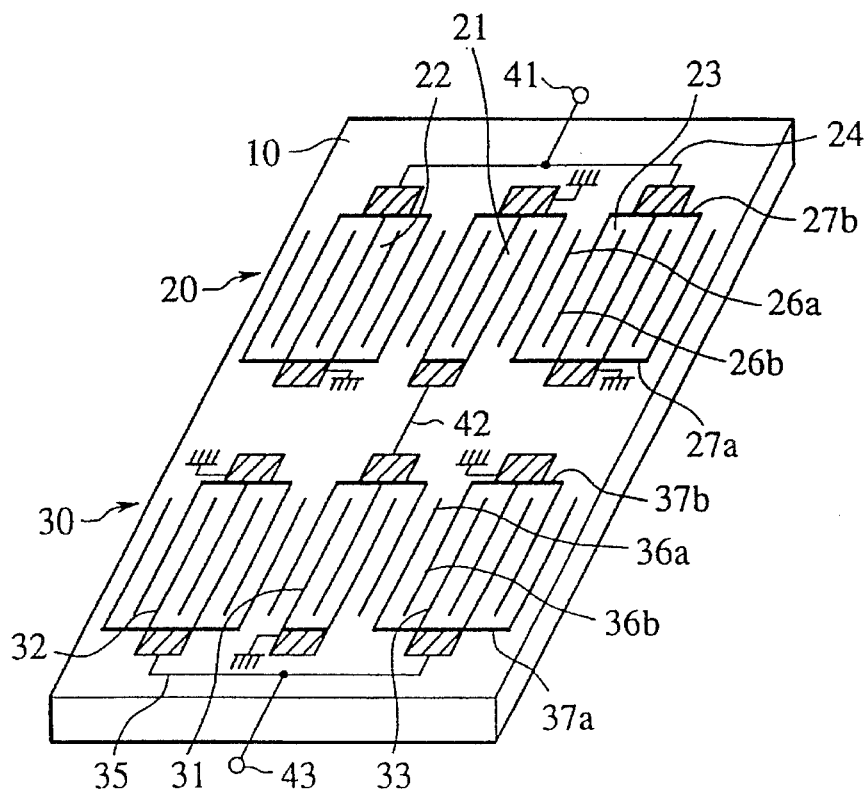
FIG. 4 is a view of the second embodiment of the transducer structure of the surface acoustic wave device according to the present invention, which is in a third connection form.

Such two rows of transducers 20, 30 can be connected in the three connection forms schematically shown in FIGS. 2, 3 and 4.

FIG. 2 shows the surface acoustic wave device in a first connection form. In the first connection form, the central interdigital transducer 21 of the first row of transducers 20 is connected to an input terminal 41, and the first and the second interdigital transducers 22, 23 of the first row are connected in parallel by wires 24, 25. The wire 25 is connected to the central interdigital transducer 31 of the second row of transducers by a cascade connection wire 42. The first and the second interdigital transducers of the second row of transducers 30 are connected in parallel to each other by a wire 35 and connected to an output terminal 43.

FIG. 3 shows the surface acoustic wave device in a second connection form. In the second connection form, the central interdigital transducer 21 of the first row of transducers 20 is connected to an input terminal 41, and the first and the second interdigital transducers 22, 23 of the first row of transducers 20 are connected to each other by a wire 24, and connected to the first and the second interdigital transducers 32, 33 by cascade connection wires 42a, 42b. The first and the second interdigital transducers 32, 33 are connected to a wire 35. The central interdigital transducer 31 of the second row of transducers 30 is connected to an output terminal 43. The cascade connection wires 42a, 42b may be interconnected to each other by an additional wire. The first and the second interdigital transducers 22, 23 of the first row of transducers 20 may be directly connected to the first and the second interdigital transducers of the second row of transducers 30 by additional wires in place of the wires 24, 35.

FIG. 4 shows the surface acoustic wave device in a third connection form. In the third connection form, the first and the second interdigital transducers of the first row of transducers 20 are connected in parallel to each other by a wire 24, which is connected to an input terminal 41. The central interdigital transducer 21 of the first row of transducers 20 is connected to the central interdigital transducer 31 of the second row transducers 30 by a cascade connection wire 42.

The first and the second interdigital transducers 32, 33 of the second row of transducers 30 are connected in parallel to each other by a wire 35, which is connected to an output terminal 43.

In the surface acoustic wave device in the first to the third connection forms, the wires 24, 25, 35, and the cascade connection wire 42 may be disposed outside the substrate 10.

The first and the second row of transducers 20, 30 may be formed on different substrates.

The input terminal 41 and the output terminal 43 are for unbalanced input/output. The other ends of the respective interdigital transducers are connected to a common potential and grounded. But one or both of the input/output terminals may be for balanced input/output, and one of the cascade connection wires may not be connected to the common potential.

In the first to the third connection forms, a specific band width, an amplitude ripple and a delay time ripple are given by numerical simulations with a total number of IDT pairs (a sum Nc+Ns of a number of the central interdigital transducer 21 pairs Nc, and a total number of the first and the second interdigital transducers 22, 23 pairs Ns) varied. TABLE 2 shows the conditions for the simulations. FIGS. 11 to 28 show the results of the simulations. In FIGS. 11 to 28, a specific band width is represented by $\Delta$; an amplitude ripple, by $\nabla$; and a group delay time ripple, by . A ratio of IDT pairs Ns/Nc is a ratio of a total number of the first and the second interdigital transducers pairs Ns to a number of the central interdigital transducers. The finger electrodes of the interdigital transducers are formed of aluminium and have a 0.5 metallization ratio. The interdigital transducers of the first row transducers, and those of the second row of transducers have the same structure.

TABLE 2

Figure 11:
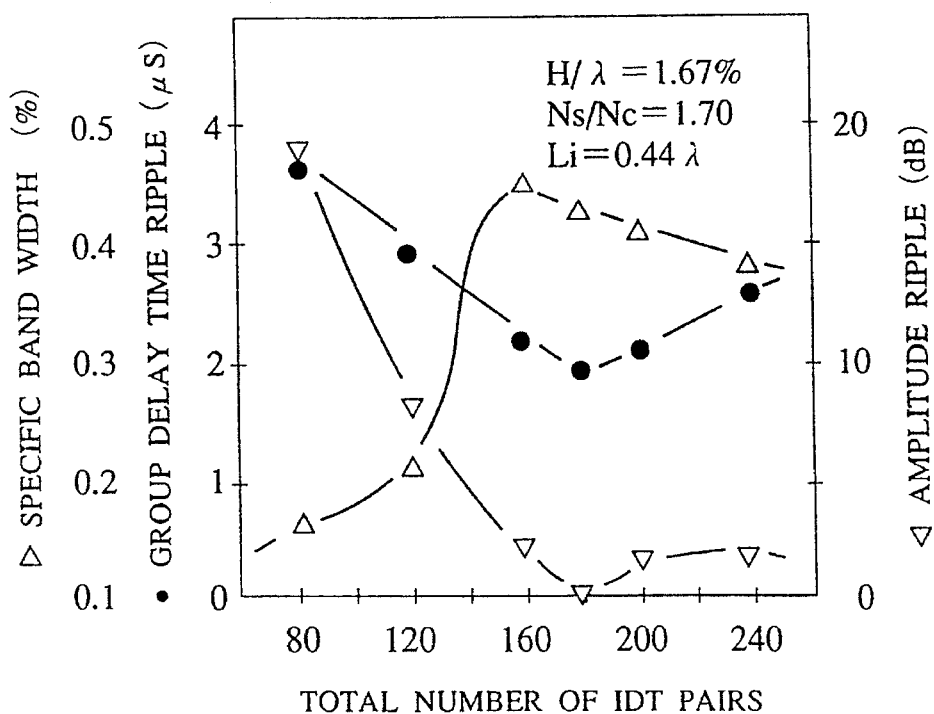
FIG. 11 is a graph of numerical simulation results with the total numbers of IDT pairs Nc+Ns varied in the transducer structure of the surface acoustic wave device according to the present invention in the first connection form.
Figure 12:
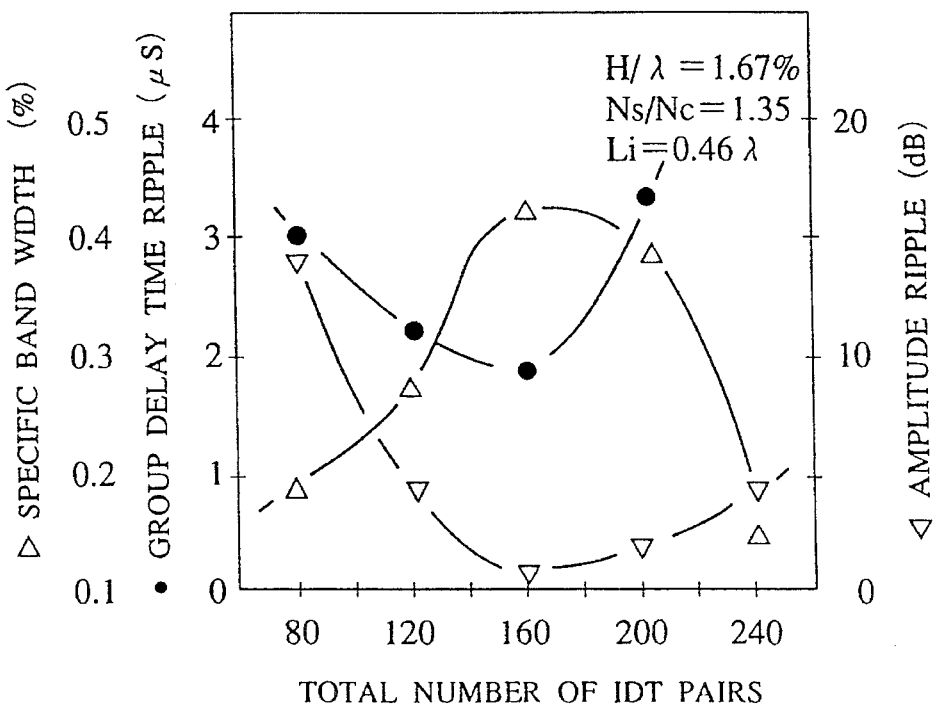
FIG. 12 is a graph of numerical simulation results with the total numbers of IDT pairs Nc+Ns varied in the transducer structure of the surface acoustic wave device according to the present invention in the first connection form.
Figure 13:
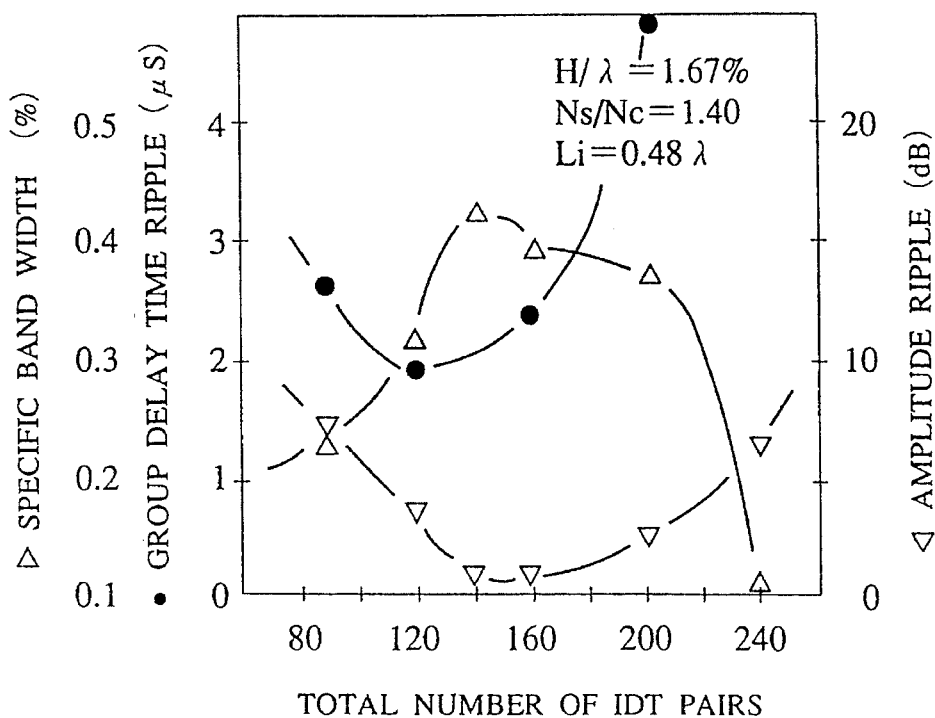
FIG. 13 is a graph of numerical simulation results with the total numbers of IDT pairs Nc+Ns varied in the transducer structure of the surface acoustic wave device according to the present invention in the first connection form.
Figure 14:
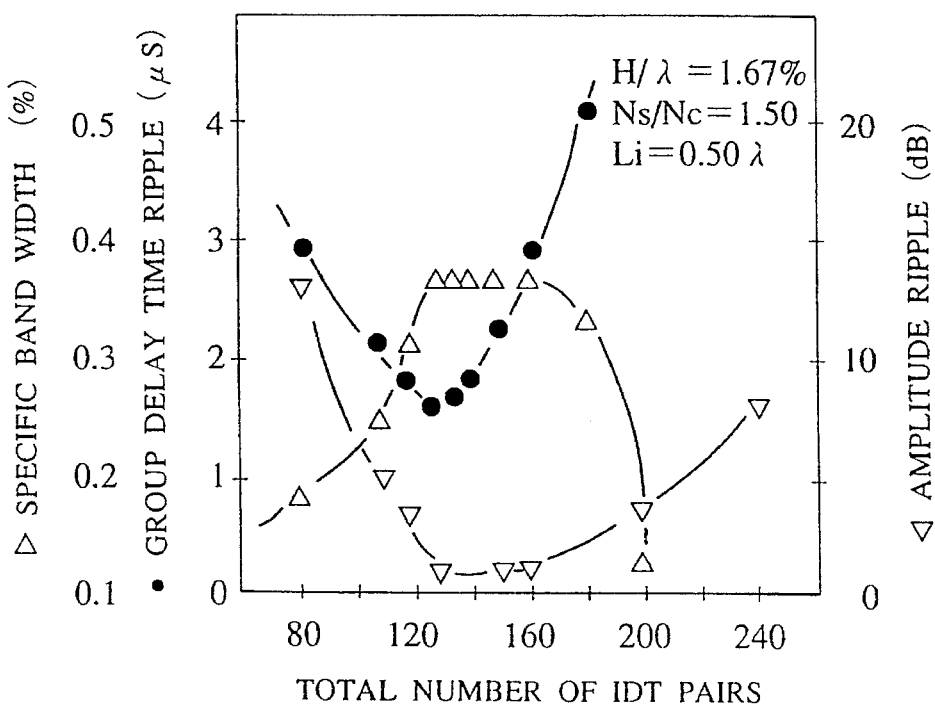
FIG. 14 is a graph of numerical simulation results with the total numbers of IDT pairs Nc+Ns varied in the transducer structure of the surface acoustic wave device according to the present invention in the first connection form.
Figure 15:
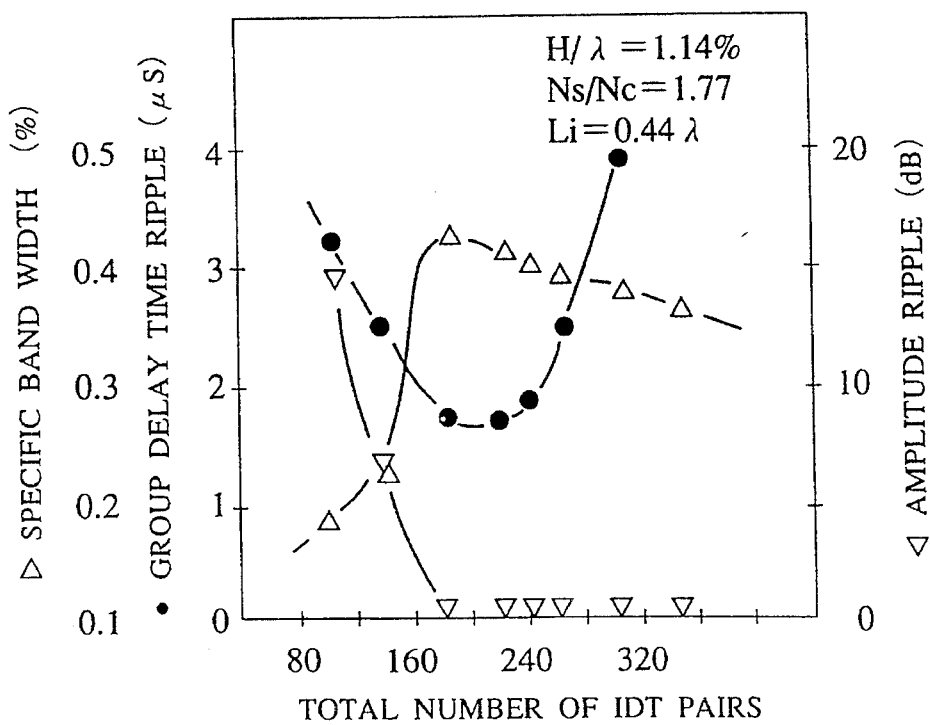
FIG. 15 is a graph of numerical simulation results with the total numbers of IDT pairs Nc+Ns varied in the transducer structure of the surface acoustic wave device according to the present invention in the first connection form.
Figure 16:
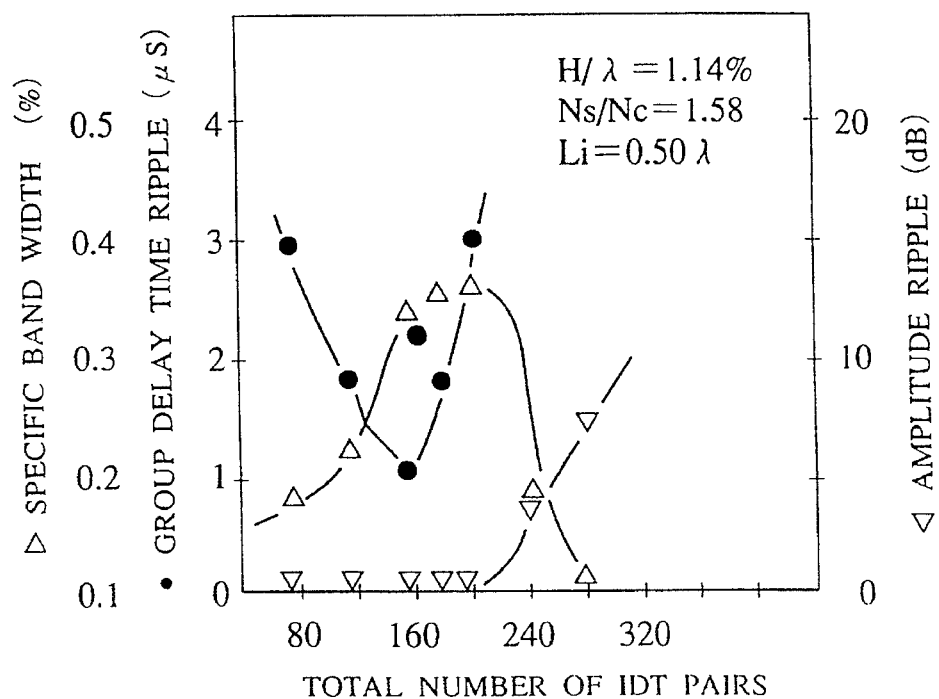
FIG. 16 is a graph of numerical simulation results with the total numbers of IDT pairs Nc+Ns varied in the transducer structure of the surface acoustic wave device according to the present invention in the first connection form.
Figure 17:
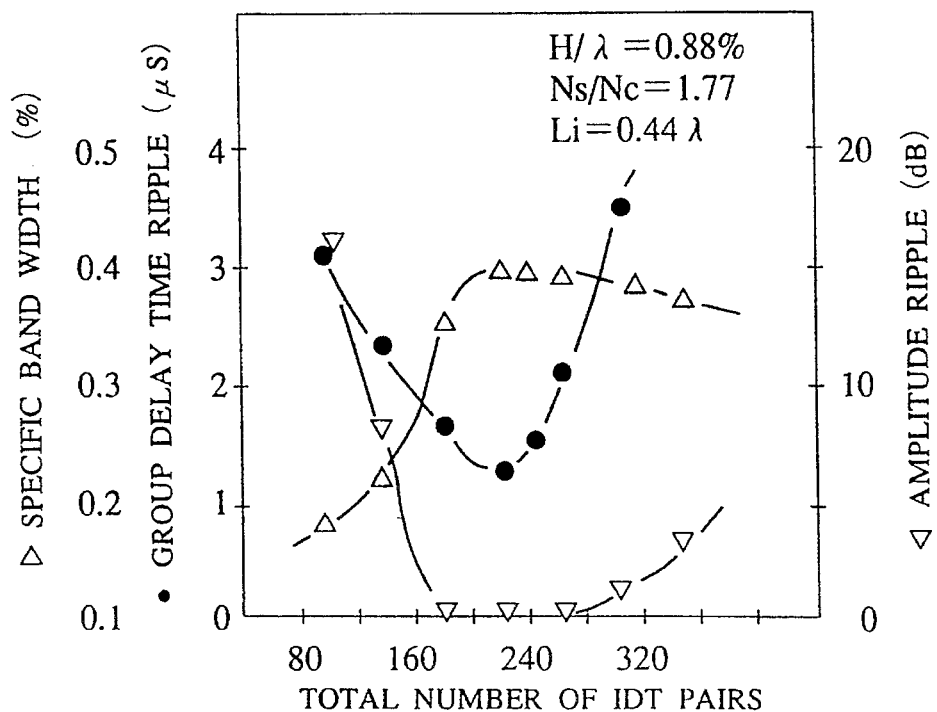
FIG. 17 is a graph of numerical simulation results with the total numbers of IDT pairs Nc+Ns varied in the transducer structure of the surface acoustic wave device according to the present invention in the first connection form.
Figure 18:
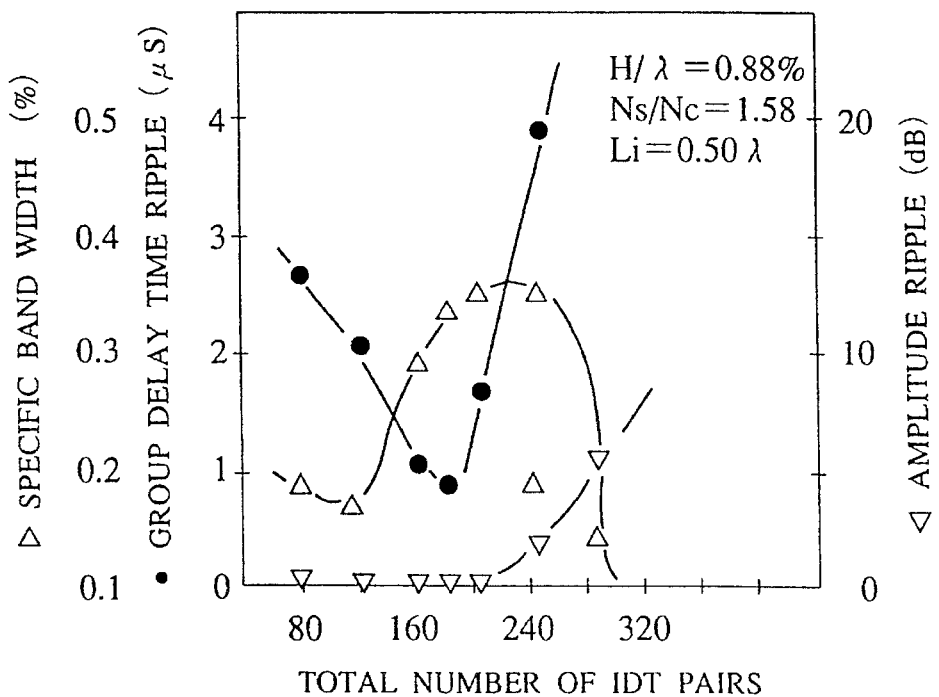
FIG. 18 is a graph of numerical simulation results with the total numbers of IDT pairs Nc+Ns varied in the transducer structure of the surface acoustic wave device according to the present invention in the first connection form.
Figure 19:
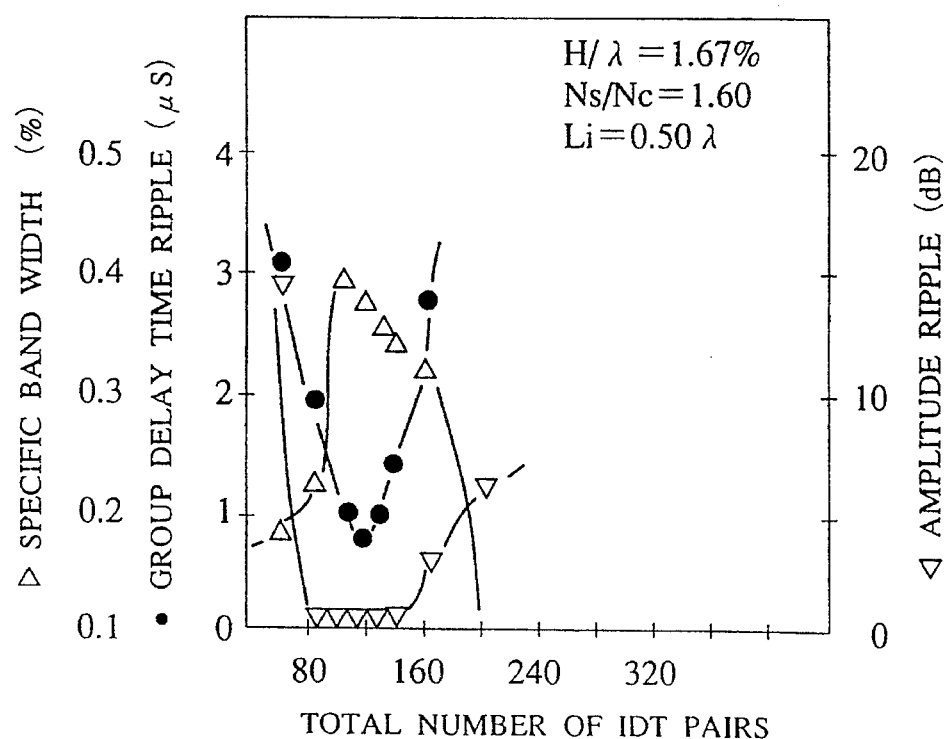
FIG. 19 is a graph of numerical simulation results with the total numbers of IDT pairs Nc+Ns varied in the transducer structure of the surface acoustic wave device according to the present invention in the second connection form.
Figure 20:
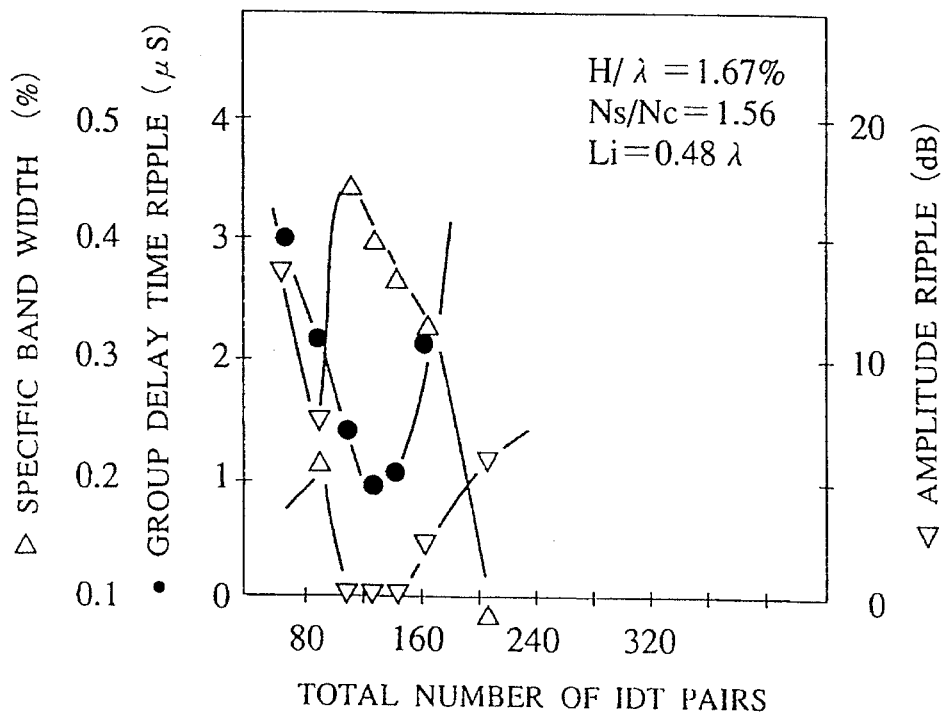
FIG. 20 is a graph of numerical simulation results with the total numbers of IDT pairs Nc+Ns varied in the transducer structure of the surface acoustic wave device according to the present invention in the second connection form.
Figure 21:
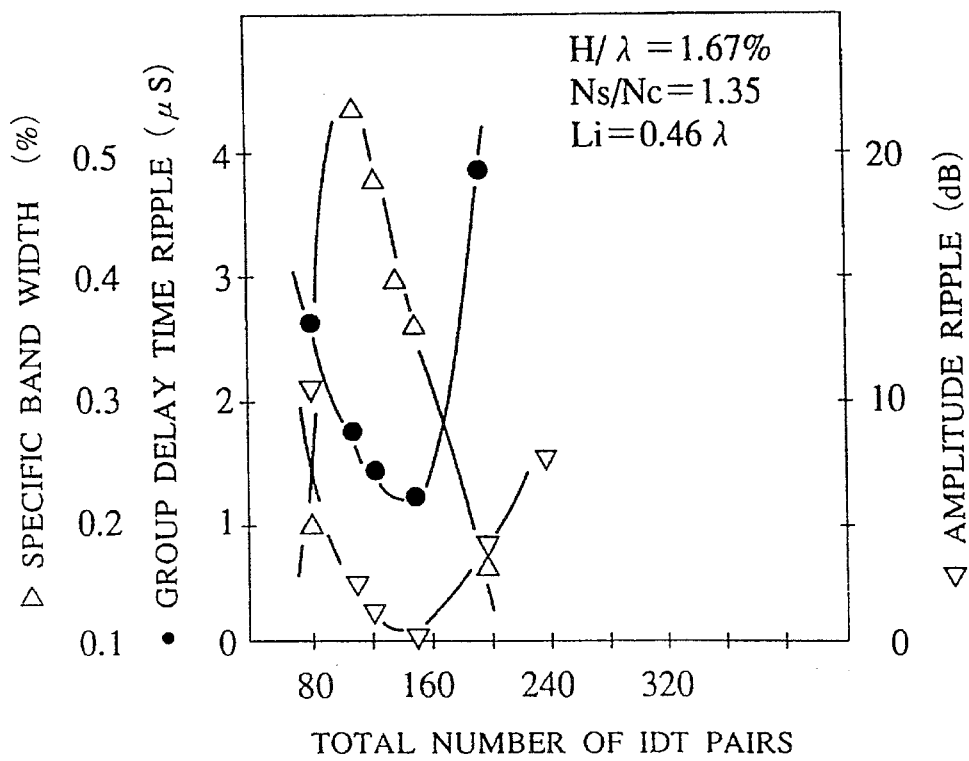
FIG. 21 is a graph of numerical simulation results with the total numbers of IDT pairs Nc+Ns varied in the transducer structure of the surface acoustic wave device according to the present invention in the second connection form.
Figure 22:
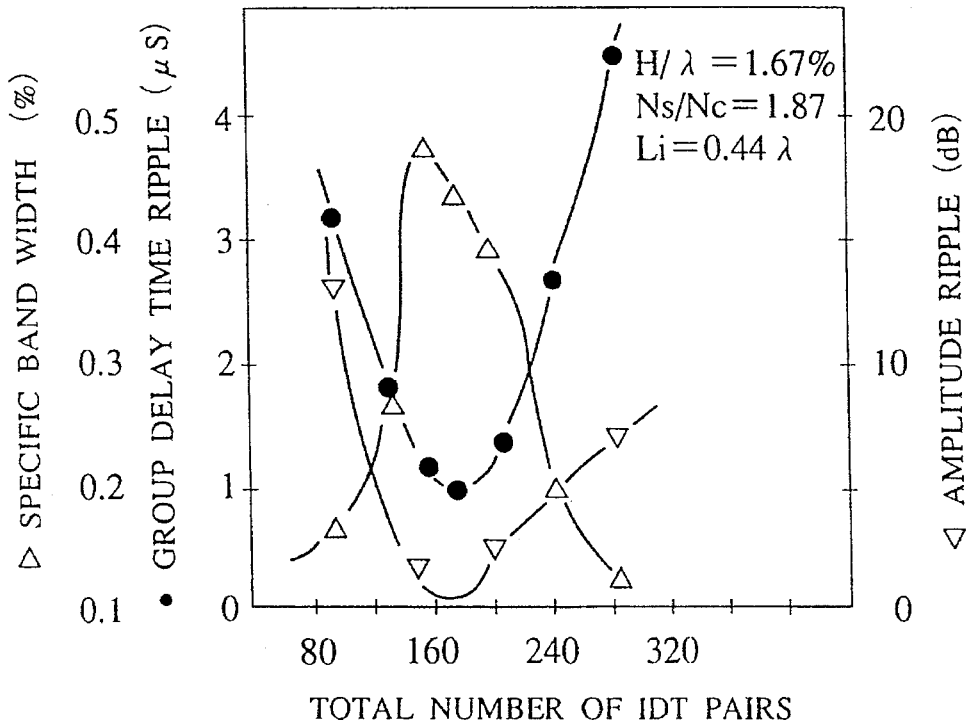
FIG. 22 is a graph of numerical simulation results with the total numbers of IDT pairs Nc+Ns varied in the transducer structure of the surface acoustic wave device according to the present invention in the second connection form.
Figure 23:
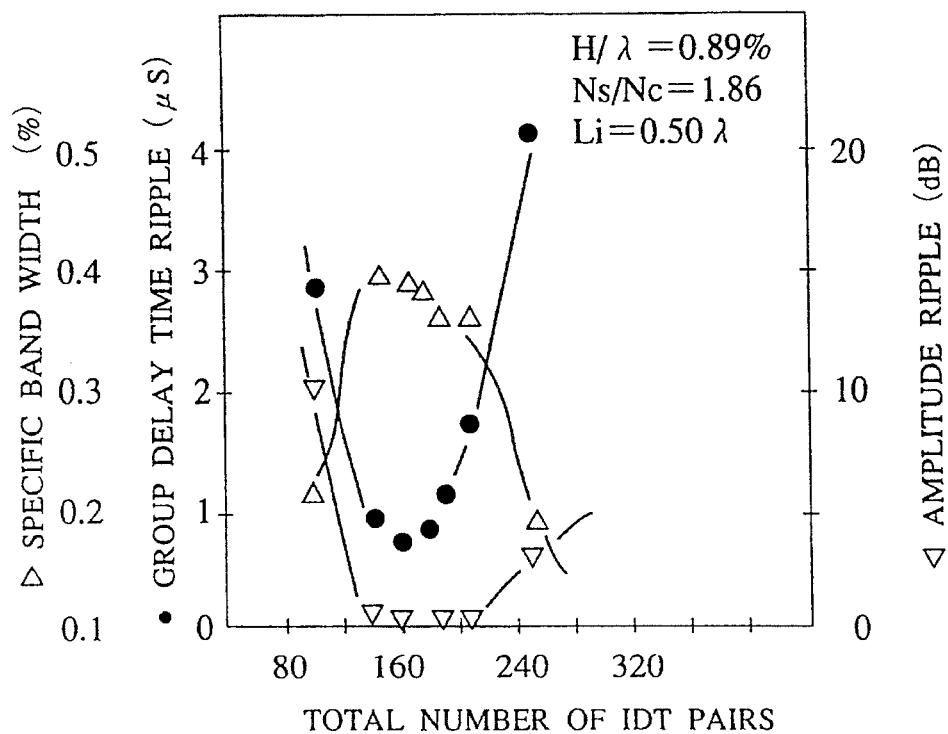
FIG. 23 is a graph of numerical simulation results with the total numbers of IDT pairs Nc+Ns varied in the transducer structure of the surface acoustic wave device according to the present invention in the second connection form.
Figure 24:
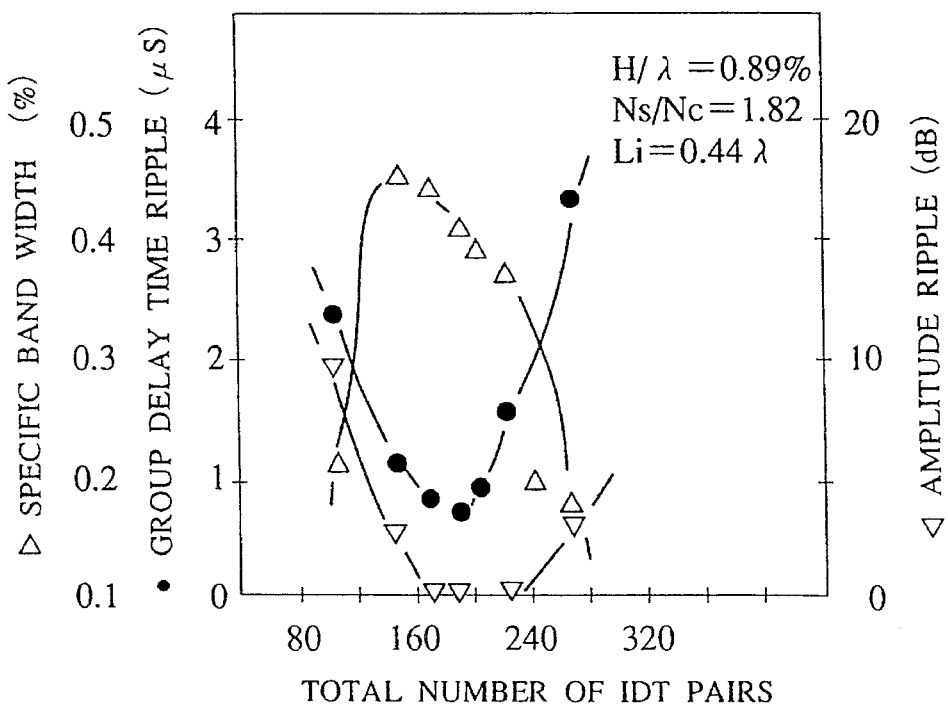
FIG. 24 is a graph of numerical simulation results with the total numbers of IDT pairs Nc+Ns varied in the transducer structure of the surface acoustic wave device according to the present invention in the second connection form.
Figure 25:
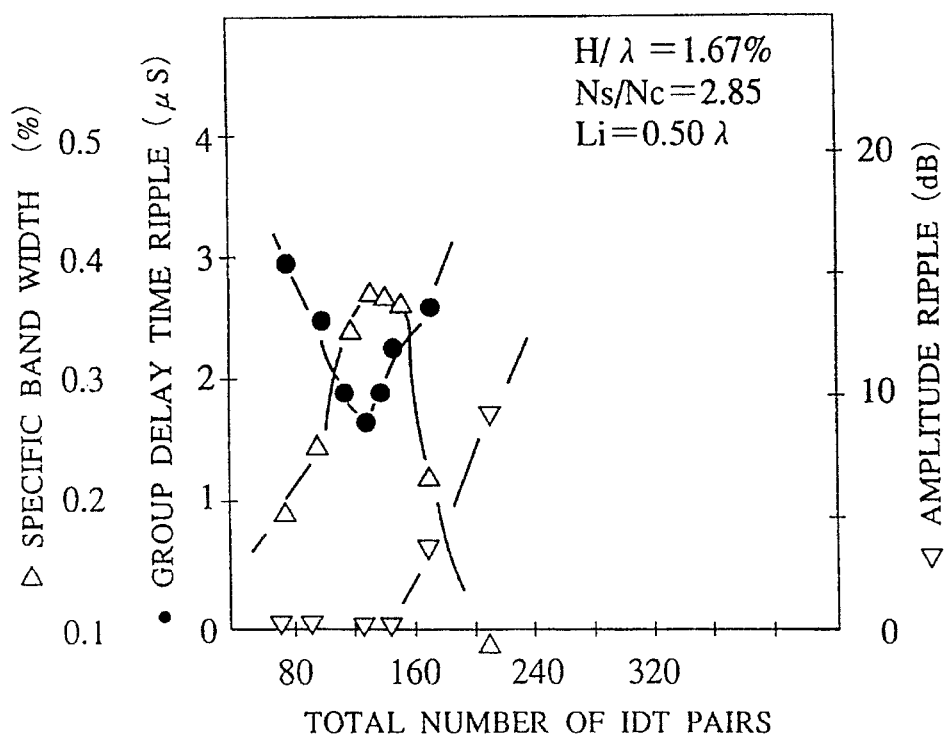
FIG. 25 is a graph of numerical simulation results with the total numbers of IDT pairs Nc+Ns varied in the transducer structure of the surface acoustic wave device according to the present invention in the third connection form.
Figure 26:
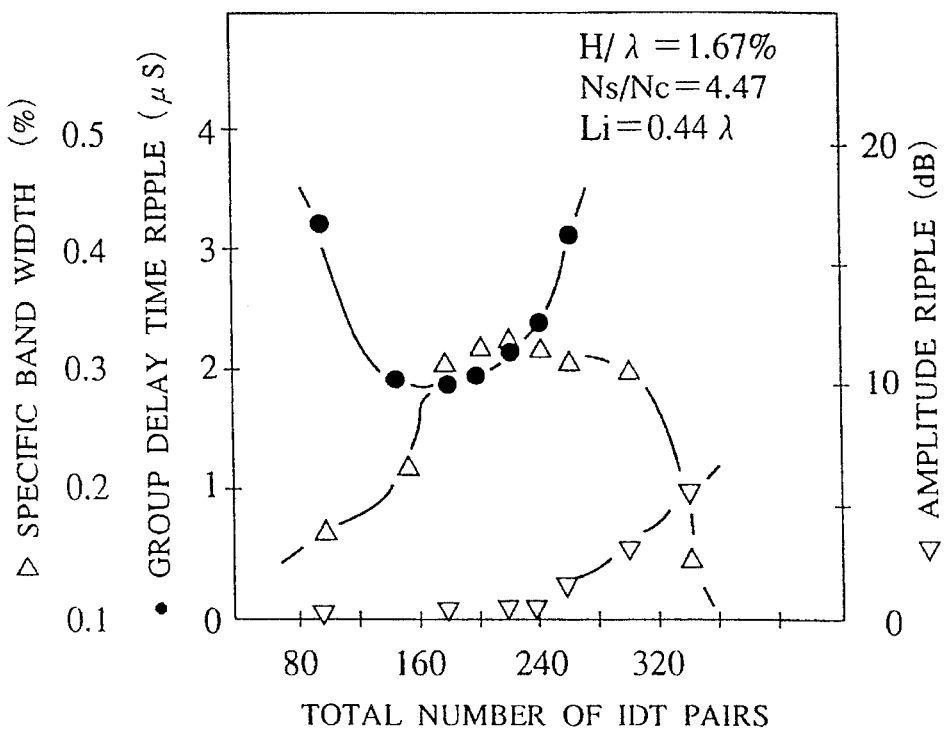
FIG. 26 is a graph of numerical simulation results with the total numbers of IDT pairs Nc+Ns varied in the transducer structure of the surface acoustic wave device according to the present invention in the third connection form.
Figure 27:
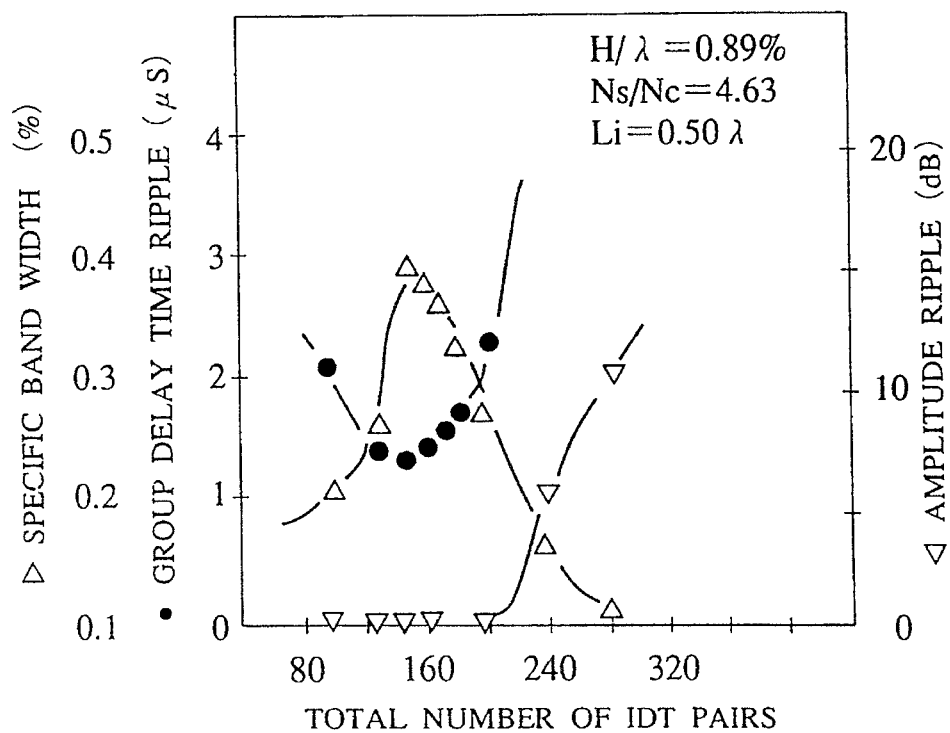
FIG. 27 is a graph of numerical simulation results with the total numbers of IDT pairs Nc+Ns varied in the transducer structure of the surface acoustic wave device according to the present invention in the third connection form.
Figure 28:
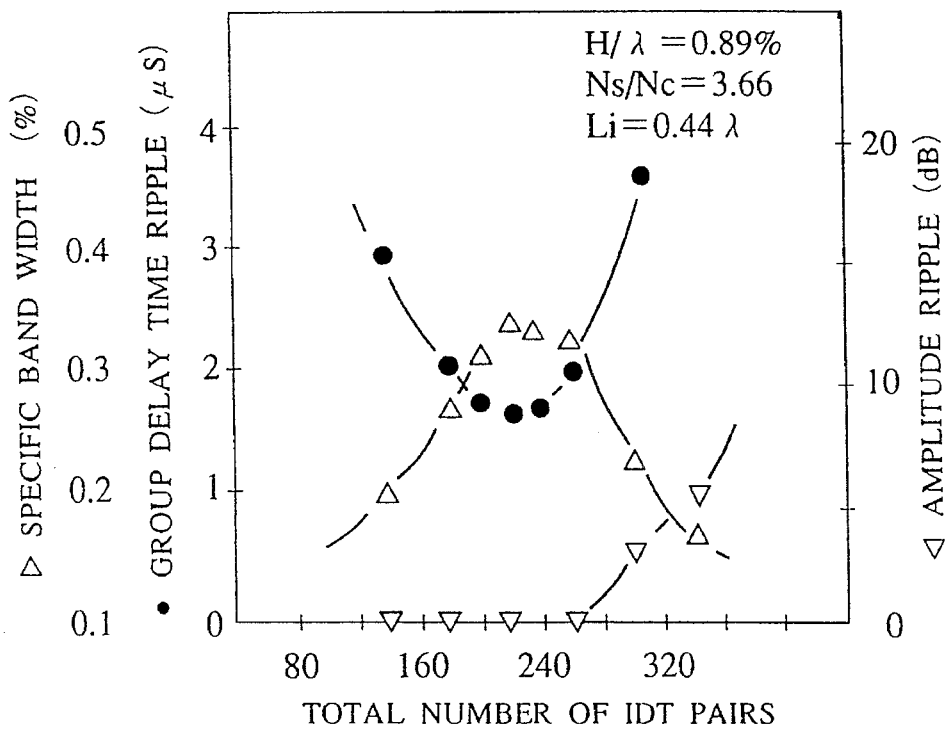
FIG. 28 is a graph of numerical simulation results with the total numbers of IDT pairs Nc+Ns varied in the transducer structure of the surface acoustic wave device according to the present invention in the third connection form.

|  | Normalized film thickness H/λ (%) | Ratio of IDT pairs Ns/Nc | IDT gap Li (λ) | Connection form |
|---|---|---|---|---|
| FIG. 11 | 1.67 | 1.70 | 0.44 | 1st, FIG. 2 |
| FIG. 12 | 1.67 | 1.35 | 0.46 | 1st, FIG. 2 |
| FIG. 13 | 1.67 | 1.40 | 0.48 | 1st, FIG. 2 |
| FIG. 14 | 1.67 | 1.50 | 0.50 | 1st, FIG. 2 |
| FIG. 15 | 1.14 | 1.77 | 0.44 | 1st, FIG. 2 |
| FIG. 16 | 1.14 | 1.58 | 0.50 | 1st, FIG. 2 |
| FIG. 17 | 0.88 | 1.77 | 0.44 | 1st, FIG. 2 |
| FIG. 18 | 0.88 | 1.58 | 0.50 | 1st, FIG. 2 |
| FIG. 19 | 1.67 | 1.60 | 0.50 | 2nd, FIG. 3 |
| FIG. 20 | 1.67 | 1.56 | 0.48 | 2nd, FIG. 3 |
| FIG. 21 | 1.67 | 1.35 | 0.46 | 2nd, FIG. 3 |
| FIG. 22 | 1.67 | 1.87 | 0.44 | 2nd, FIG. 3 |
| FIG. 23 | 0.89 | 1.86 | 0.50 | 2nd, FIG. 3 |
| FIG. 24 | 0.89 | 1.82 | 0.44 | 2nd, FIG. 3 |
| FIG. 25 | 1.67 | 2.85 | 0.50 | 3rd, FIG. 4 |
| FIG. 26 | 1.67 | 4.47 | 0.44 | 3rd, FIG. 4 |
| FIG. 27 | 0.89 | 4.63 | 0.50 | 3rd, FIG. 4 |
| FIG. 28 | 0.89 | 3.66 | 0.44 | 3rd, FIG. 4 |

In the first connection form, as shown in the simulation results of FIGS. 11 to 18, to obtain an above 0.3% specific band width, a below 6 dB amplitude ripple, and a below 3 μS group delay time ripple, a total number Nc+Ns is set at a range of 165–285 pairs for an about 0.9% normalized film thickness, at 145–280 pairs for an about 1.2% normalized film thickness, and at 115–270 pairs for an about 1.6% normalized film thickness. It is also shown that to obtain a below 2 μS group delay time ripple, a total number Nc+Ns is set at a range of 165–225 pairs for an about 0.9% normalized film thickness, at 145–240 pairs for an about 1.2% normalized film thickness, and at 115–195 pairs for an about 1.6% normalized film thickness.

Figure 29:
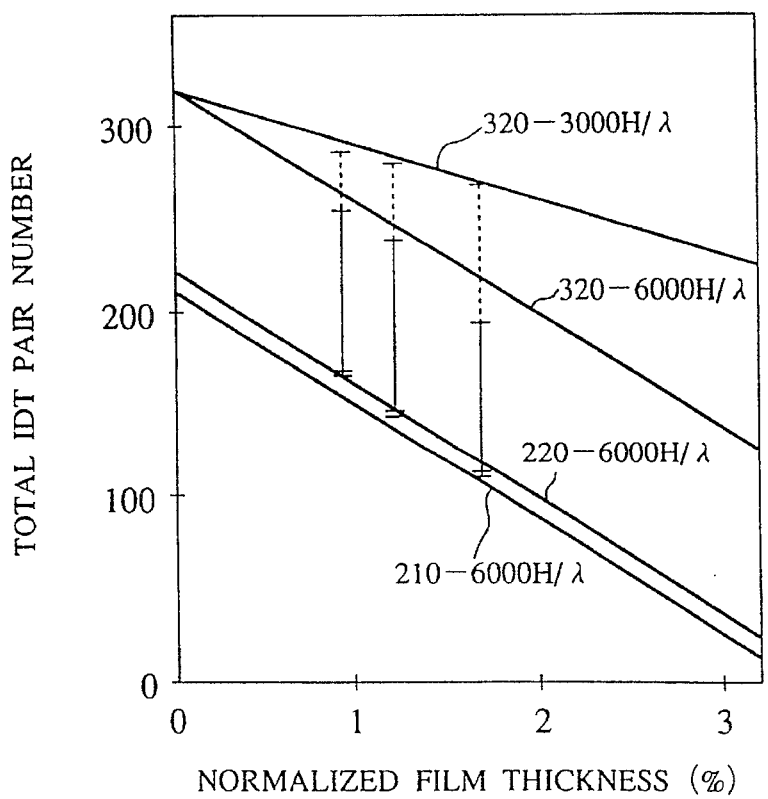
FIG. 29 is a graph of relationships between suitable total numbers of IDT pairs Nc+Ns and normalized film thicknesses H/λ of the surface acoustic wave device according to the present invention in the first connection form.

The above-described suitable ranges are shown in relationships between the total number of IDT pairs Nc+Ns and the normalized film thickness H/λ in FIG. 29. A suitable total number of IDT pairs Nc+Ns range is indicated by the broken line, and a preferable total number of IDT pairs Nc+Ns is indicated by the solid line.

As shown in the relationships, it is preferred that a total number of IDT pairs Nc+Ns satisfies the following formula $$210-6000H/\lambda \leq Nc+Ns \leq 320-3000H/\lambda.$$

Especially a total number of IDT pairs Nc+Ns preferably satisfies the following formula $$220-6000H/\lambda \leq Nc+Ns \leq 320-6000H/\lambda.$$

In the second connection form, as shown in the simulation results of FIGS. 19 to 24, to obtain an above 0.3% specific band width, a below 6 dB amplitude ripple, and a below 3 µS group delay time ripple, a total number of IDT pairs Nc+Ns is set at a range of 120–245 pairs for an about 0.9% normalized film thickness, and at 90–210 pairs for an about 1.6% normalized film thickness. It is also shown that to obtain a below 2 µS group delay time ripple, a total number of IDT pairs Nc+Ns is set at a range of 120–235 pairs for an about 0.9% normalized film thickness, and 95–210 pairs for an about 1.6% normalized film thickness.

Figure 30:
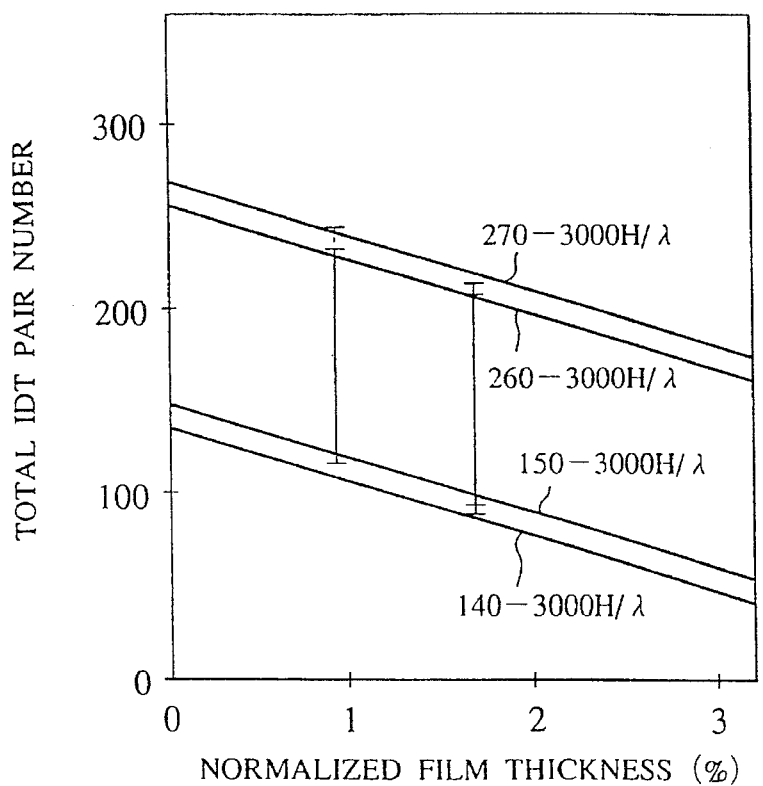
FIG. 30 is a graph of relationships between suitable total numbers of IDT pairs Nc+Ns and normalized film thicknesses H/λ of the surface acoustic wave device according to the present invention in the second connection form.

The above-described suitable ranges are shown in relationships between the total number of IDT pairs Nc+Ns and the normalized film thickness H/λ in FIG. 30. A suitable total number of IDT pairs Nc+Ns range is indicated by the broken line, and a preferable total number of IDT pairs Nc+Ns is indicated by the solid line.

As shown in the relationships, it is preferred that a total number of IDT pairs Nc+Ns satisfies the following formula $$140-3000H/\lambda \leq Nc+Ns \leq 270-3000H/\lambda.$$

Especially a total number of IDT pairs Nc+Ns preferably satisfies the following formula $$150-3000H/\lambda \leq Nc+Ns \leq 260-3000H/\lambda.$$

In the third connection form, as shown in the simulation results of FIGS. 25 to 28, to obtain an above 0.3% specific band width, a below 6 dB amplitude ripple, and a below 1.5 µS group delay time ripple, a total number of IDT pairs Nc+Ns is set at a range of 140–270 pairs for an about 0.9% normalized film thickness, and a range of 110–260 pairs for an about 1.6% normalized film thickness. It is also shown that to obtain a below 2 µS group delay time ripple, a total number of IDT pairs Nc+Ns is set at a range of 140–250 pairs for an about 0.9% normalized film thickness, and at 110–200 pairs for an about 1.6% normalized film thickness.

Figure 31:
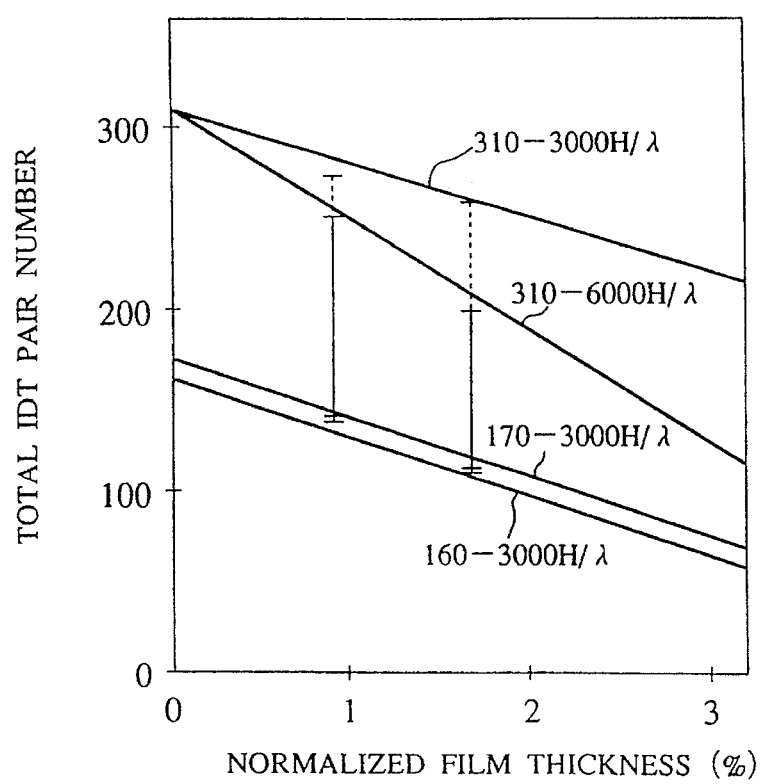
FIG. 31 is a graph of relationships between suitable total numbers of IDT pairs Nc+Ns and normalized film thicknesses H/λ of the surface acoustic wave device according to the present invention in the third connection form.

The above-described suitable ranges are shown in relationships between the total number of IDT pairs Nc+Ns and the normalized film thickness H/λ in FIG. 31. A suitable total number of IDT pairs range is indicated by the broken line, and a preferable total number of IDT pairs Nc+Ns is indicated by the solid line.

As shown in the relationships, it is preferred that a total number of IDT pairs Nc+Ns satisfies the following formula $$160-3000H/\lambda \leq Nc+Ns \leq 310-3000H/\lambda.$$

Especially a total number of IDT pairs Nc+Ns preferably satisfies the following formula $$170-3000H/\lambda \leq Nc+Ns \leq 310-6000H/\lambda.$$

In the case that the first row of transducers 20 and the second row of transducers 30 are connected in cascade in two propagation tracks, it is found that an IDT gap Li is preferably in a 0.40–0.54 λ range, and especially an about 0.45 λ range, i.e. 0.43–0.47 λ range, is more preferable because wider specific band widths are available.

In addition, it is noted that a ratio of IDT pairs (a ratio Ns/Nc of a total number of the first and the second interdigital transducers pairs Ns to a number of the central interdigital transducer pairs 22, 23) is more influential on characteristics of spurious peaks in lower frequency than a pass band.

Figure 32:
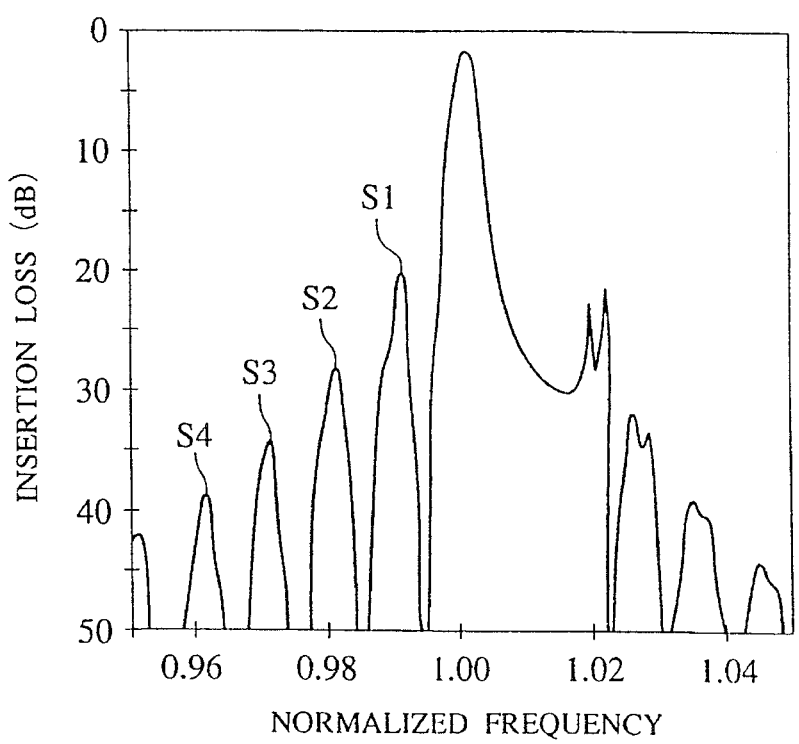
FIG. 32 is a graph of the typical frequency response of the surface acoustic wave device.

FIG. 32 shows a typical frequency response of the surface acoustic wave device. It is shown that spurious peaks are present in the lower frequency side of the necessary pass band. The spurious peaks are called Spurious 1, Spurious 2, Spurious 3, Spurious 4 sequentially from the nearest one to the pass band and are represented by S1, S2, S3 and S4.

Frequency response is given by numerical simulations on various conditions with an ratio Ns/Nc of the first row of transducers 20 varied. The conditions are shown in TABLE 3. Relationships between attenuations of the respective spurious peaks and the ratio of IDT pairs are shown in FIGS. 33–37. The finger electrodes are formed of aluminium, and metallization ratios of the finger electrodes are 0.50.

TABLE 3

Figure 33:
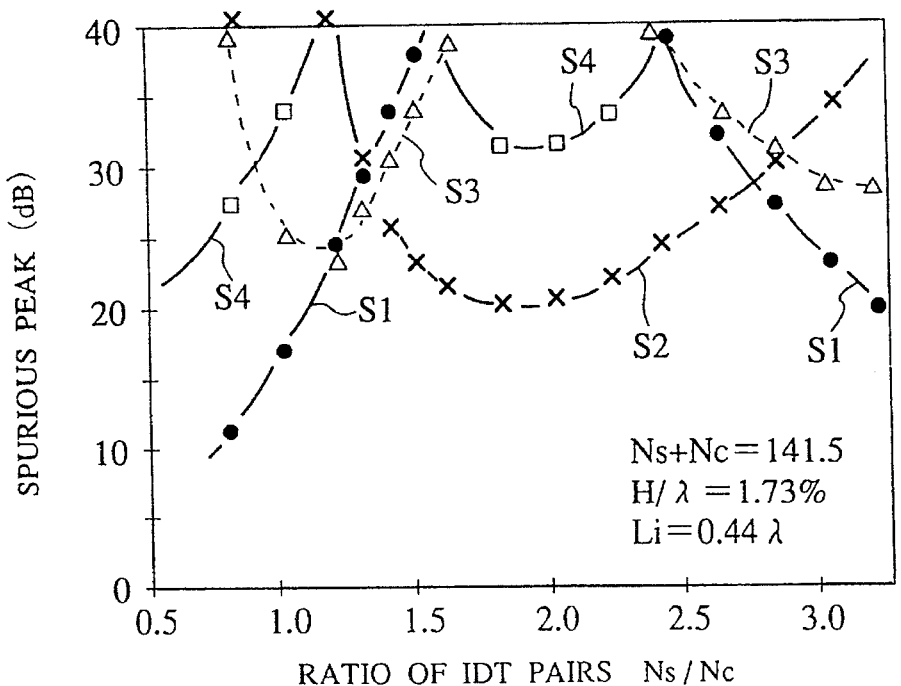
FIG. 33 is a graph of numerical simulation results of spurious peaks in lower-frequency region with the ratio of IDT pairs Ns/Nc varied.
Figure 34:
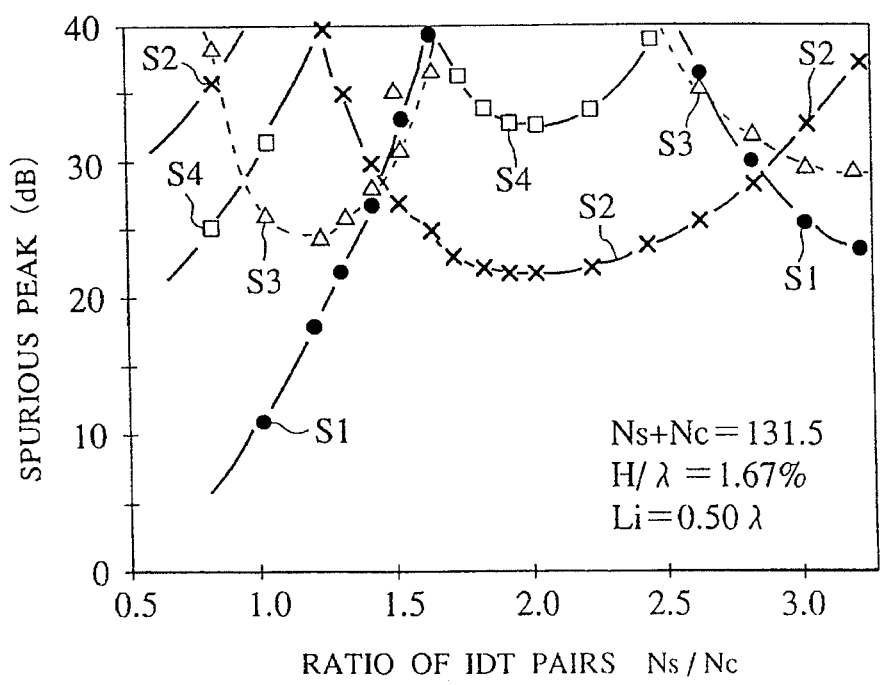
FIG. 34 is a graph of numerical simulation results of spurious peaks in lower-frequency region with the ratio of IDT pairs Ns/Nc varied.
Figure 35:
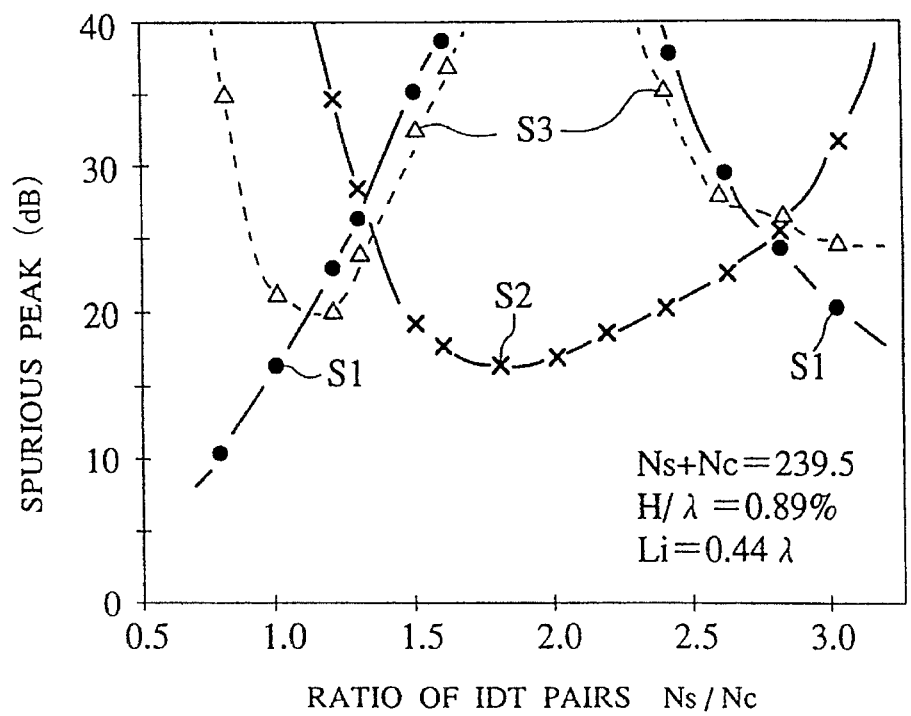
FIG. 35 is a graph of numerical simulation results of spurious peaks in lower-frequency region with the ratio of IDT pairs Ns/Nc varied.
Figure 36:
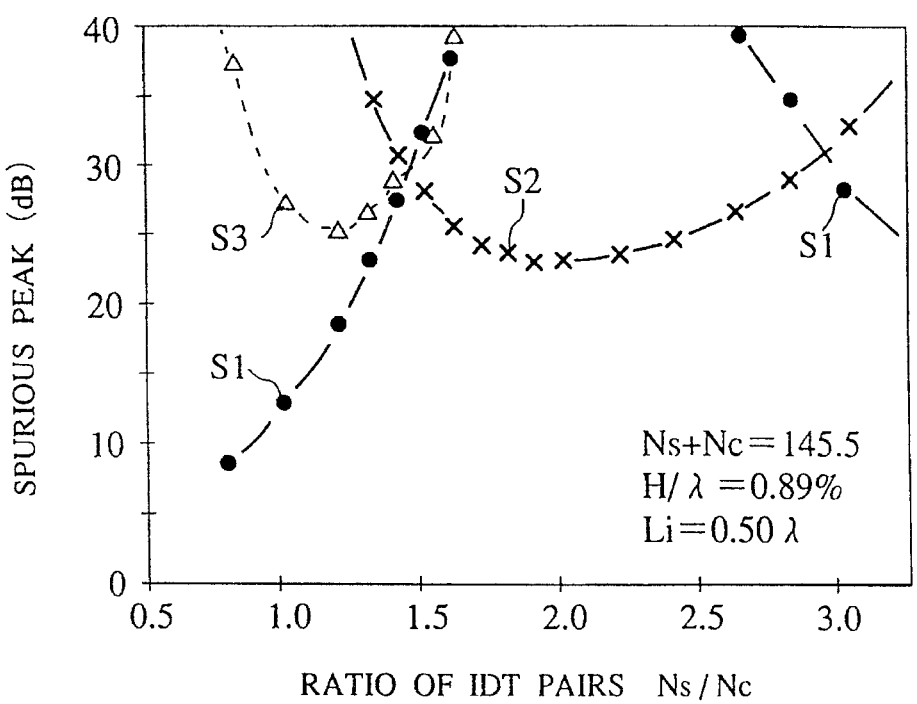
FIG. 36 is a graph of numerical simulation results of spurious peaks in lower-frequency region with the ratio of IDT pairs Ns/Nc varied.
Figure 37:
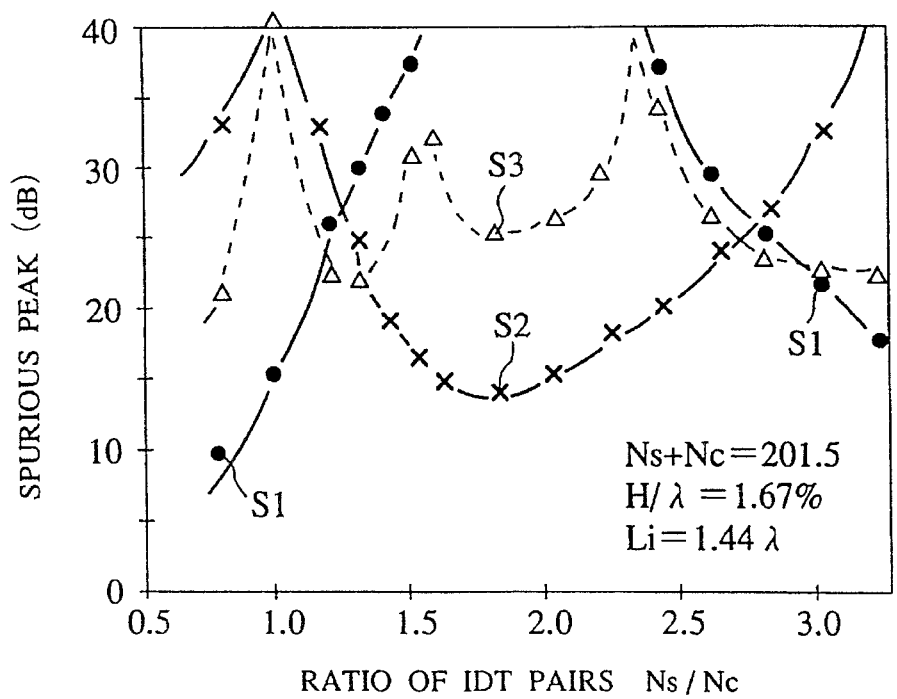
FIG. 37 is a graph of numerical simulation results of spurious peaks in lower-frequency region with the ratio of IDT pairs Ns/Nc varied.

|  | Total number of IDT pairs Ns + Nc | Normalized film thickness H/λ (%) | IDT gap Li (λ) |
| --- | --- | --- | --- |
| FIG. 33 | 141.5 | 1.73 | 0.44 |
| FIG. 34 | 131.5 | 1.67 | 0.50 |
| FIG. 35 | 239.5 | 0.89 | 0.44 |
| FIG. 36 | 145.5 | 0.89 | 0.50 |
| FIG. 37 | 201.5 | 1.67 | 1.44 |

As shown in FIGS. 33–37, the spurious peaks are at a minimum around a 1.3 or a 2.8 ratio of IDT pairs. The spurious peaks are smaller in a range where the ratio of IDT pairs Ns/Nc satisfies $$1.0 \leq Ns/Nc \leq 1.6 \text{ or } 2.5 \leq Ns/Nc \leq 3.1.$$

Still greater attenuation of spurious peaks takes place in a range where the ratio of IDT pairs Ns/Nc is $$1.1 \leq Ns/Nc \leq 1.4 \text{ or } 2.7 \leq Ns/Nc \leq 2.9.$$

In this case, the cascade connection of the first row of transducers 20 and the second row of transducers 30 results in better attenuation of spurious peaks of above 50 dB.

Figure 38:
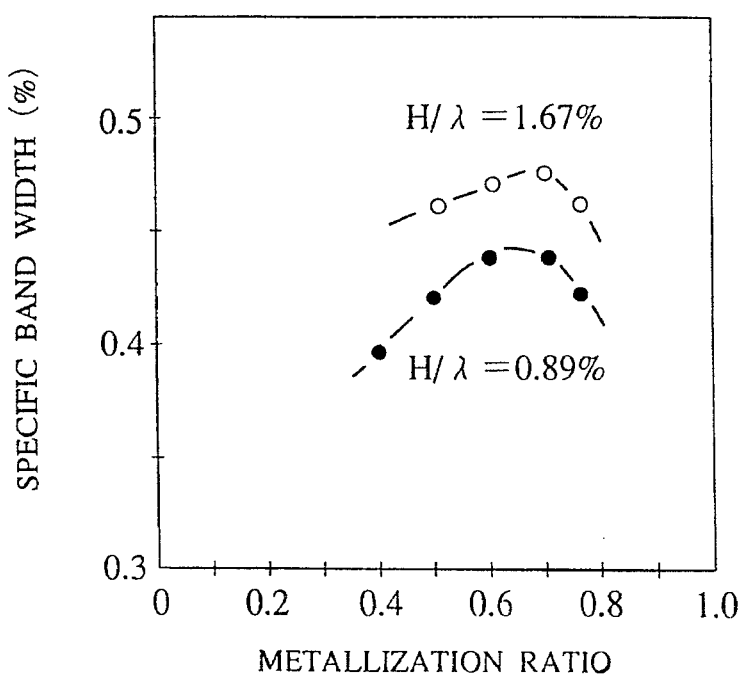
FIG. 38 is a graph of pass band widths and metallization ratios of the surface acoustic wave device according to the present invention.

Furthermore, the inventor found that a wider pass band can be obtained by setting the metallization ratio in a suitable range. FIG. 38 shows changes of a pass band width corresponding to metallization ratios. In FIG. 38, changes of the pass band width are shown for 0.89% and 1.67% normalized film thicknesses H/λ. In both cases, the pass band is widened at a metallization ratio of above 0.5 but below 0.75. Especially the metallization ratio is preferably above 0.6 but below 0.7.

In this case, the transducers have the structure of FIG. 1. For a 0.89% normalized film thickness H/λ, an IDT gap Li is 0.44 λ, a number of IDT pairs Nc of the central IDT is 86, and a number of the first and the second IDTs pairs is 76, namely a total number of the first and the second IDTs pairs Ns is 152. For a 1.67% normalized film thickness H/λ, an IDT gap Li is 0.46 λ, a number of the central IDT pairs Nc is 66, and a number of the first and the second IDTs pairs is 44, namely a total number of the first and the second IDTs pairs Ns is 88.

As a first to a fifth examples, the surface acoustic wave filters of the structure of FIG. 1 were fabricated and evaluated. The structures of the first to the fifth examples are numerically shown in TABLE 4, and their frequency response are shown in FIGS. 39 to 43.

In the first to the fifth examples, substrates 10 are 45° or 43° Y rotated X cut lithium tetraborate single crystal substrates. The propagation direction of surface acoustic waves is the Z direction. Interdigital transducers 21, 22, 23 are of the so-called normal type whose overlapped finger electrodes are substantially equal to one another. An aperture length of the interdigital transducers 21, 22, 23 is 6.88 λ.

Patterns of the interdigital transducers, the wires, the cascade connection wires, etc. were formed by lift-off process following vaporization of aluminium films on resist patterns formed by the known photolithography.

Evaluation of pass band characteristics were made with a terminal impedance set at 520 Ω+j230 Ω. A frequency f is represented by a normalized frequency f/fo normalized by a center frequency fo of a pass band.

TABLE 4

Figure 39:
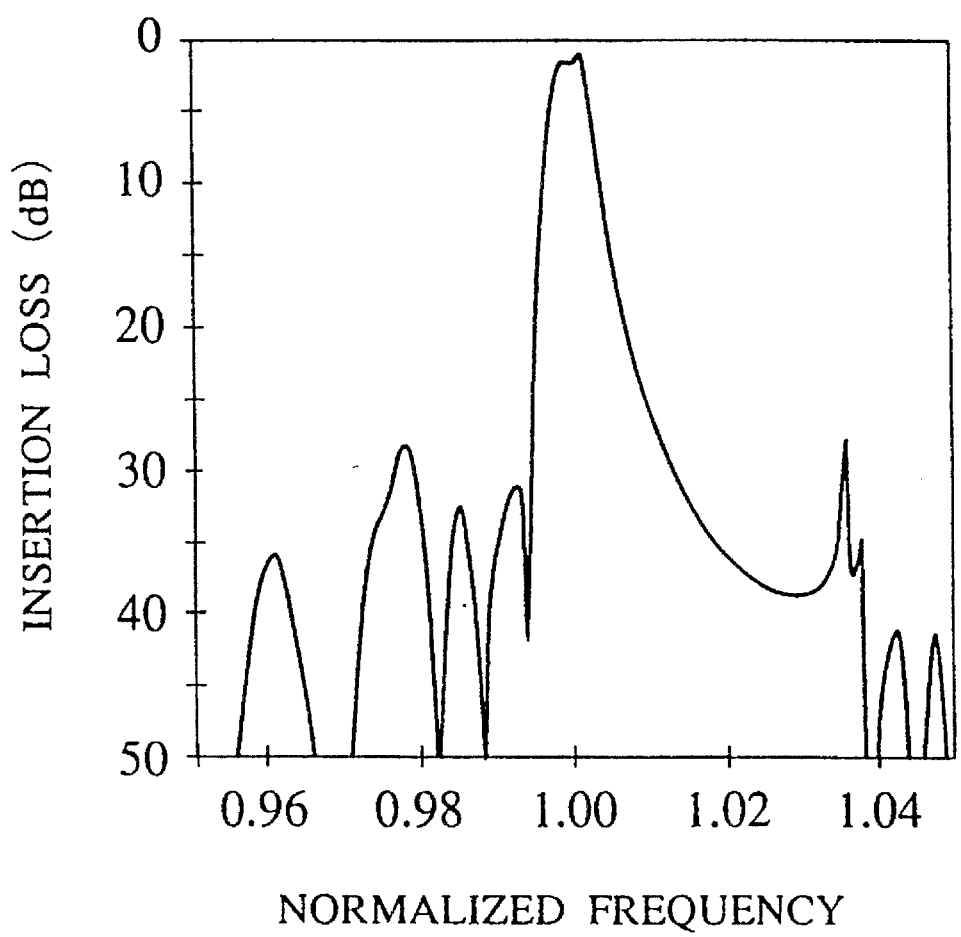
FIG. 39 is a view of frequency response of insertion losses in the surface acoustic wave filter according to a first example of the present invention.
Figure 40:
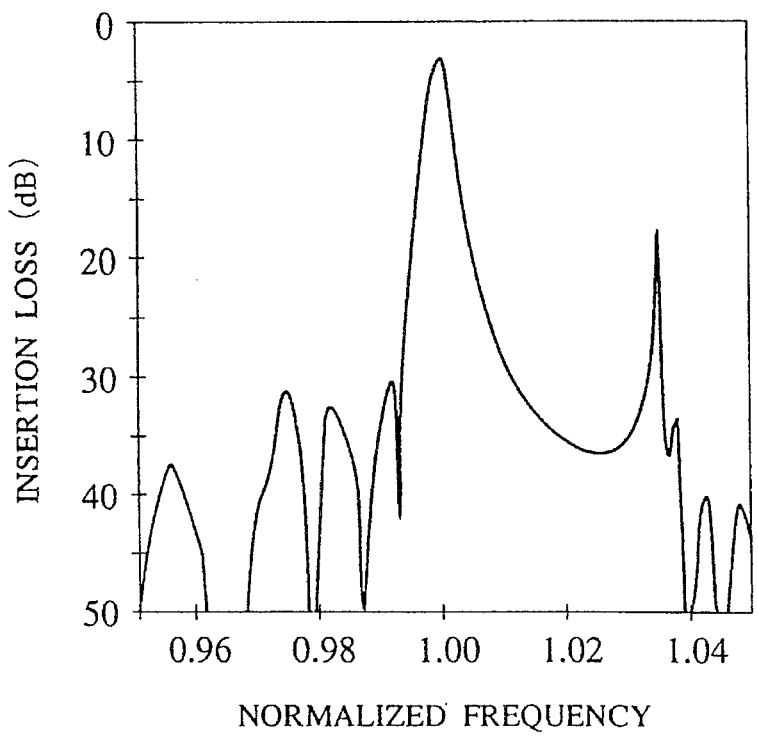
FIG. 40 is a view of frequency response of Insertion losses in the surface acoustic wave filter according to a second example of the present invention.
Figure 41:
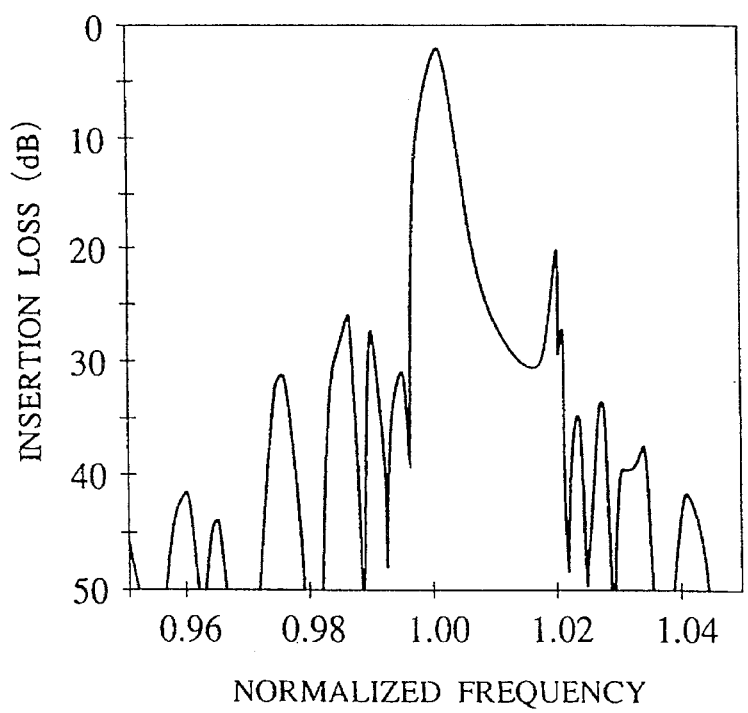
FIG. 41 is a view of frequency response of insertion losses in the surface acoustic wave filter according to a third example of the present invention.
Figure 42:
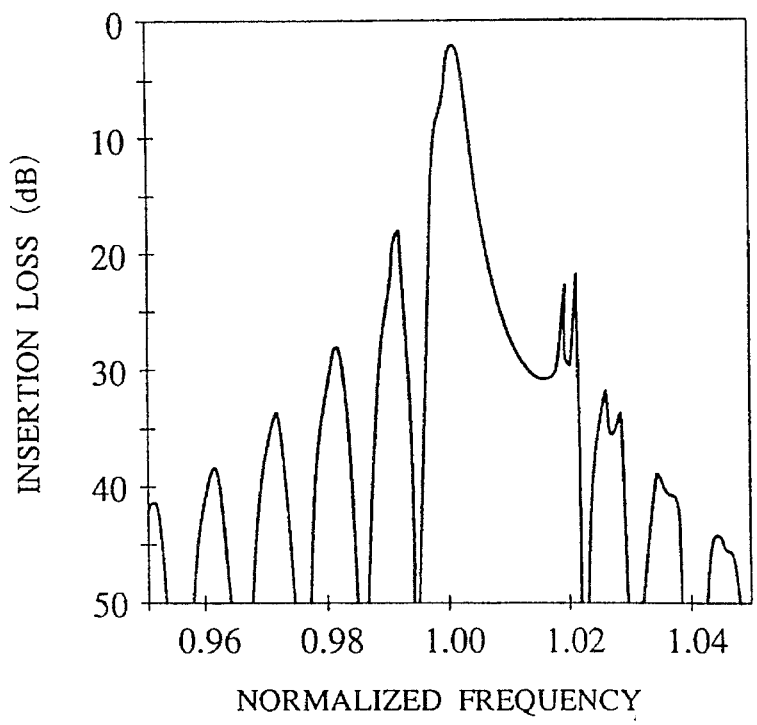
FIG. 42 is a view of frequency response of insertion losses in the surface acoustic wave filter according to a fourth example of the present invention.
Figure 43:
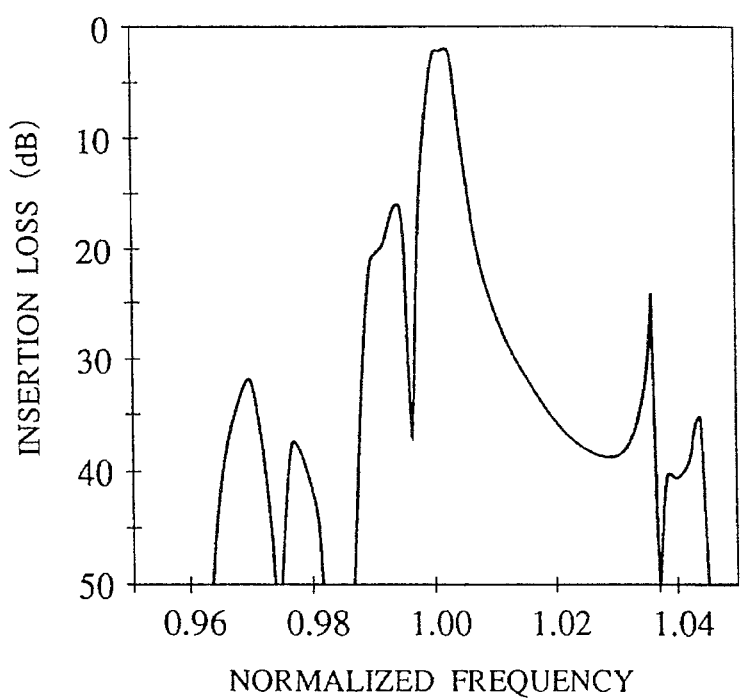
FIG. 43 is a view of frequency response of insertion losses in the surface acoustic wave filter according to a fifth example of the present invention.

| | Examples | | | | |
|---|---|---|---|---|---|
| | 1 | 2 | 3 | 4 | 5 |
| Transducer structure | FIG. 1 | FIG. 1 | FIG. 1 | FIG. 1 | FIG. 1 |
| Normalized film thickness(%) | 1.70 | 1.67 | 0.88 | 0.88 | 1.67 |
| Number of central IDT pairs | 61 | 54 | 102 | 86 | 70 |
| Number of 1st & 2nd IDTs pairs | 40 | 36 | 66 | 86 | 30 |
| Total number of IDT pairs | 141 | 126 | 234 | 258 | 130 |
| Ratio of IDT pairs | 1.31 | 1.33 | 1.29 | 2.00 | 0.86 |
| IDT gap (λ) | 0.44 | 0.50 | 0.44 | 0.44 | 0.44 |
| Frequency response | FIG. 39 | FIG. 40 | FIG. 41 | FIG. 42 | FIG. 43 |

In the first example the frequency response of FIG. 39 is obtained. Good pass band characteristics of a 0.50% 3 dB specific band width, a 4.0 dB minimum insertion loss, a 0.8 dB amplitude ripple and a 0.5 μS group delay time ripple are obtained. Spurious peaks in lower frequency are below 30 dB, which is a good attenuation characteristic.

In the second example the frequency response of FIG. 40 is obtained. Good pass band characteristics of a 0.42% 3 dB specific band width, a 4.3 dB minimum insertion loss, a 0 dB amplitude ripple (because of single peak characteristic) and a 0.4 μS group delay time ripple are obtained. Spurious peaks in lower frequency are below 30 dB, which is a good attenuation characteristic.

In the third example the frequency response of FIG. 41 is obtained. Good pass band characteristics of a 0.39% 3 dB specific band width, a 4.5 dB minimum insertion loss, a 0 dB amplitude ripple (because of single peak characteristic) and a 0.3 μS group delay time ripple are obtained. Spurious peaks in lower frequency are below 25 dB.

In the fourth example the frequency response of FIG. 42 is obtained. Good pass band characteristics of a 0.36% 3 dB specific band width, a 2.0 dB minimum insertion loss, a 0 dB amplitude ripple (because of single peak characteristic) and a 0.49 μS group delay time ripple are obtained. But spurious peaks in lower frequency are as high as 18 dB.

In the fifth example the frequency response of FIG. 43 is obtained. Pass band characteristics of a 0.52% 3 dB specific band width, a 2.4 dB minimum insertion loss, a 0.6 dB amplitude ripple and a 1.26 μS group delay time ripple are obtained. But spurious peaks in lower frequency are as high as 16 dB.

As sixth to eleventh examples, the surface acoustic wave filters of the structure of FIGS. 2 to 4 are fabricated and evaluated. The structures of the sixth to the eleventh examples are numerically shown in TABLE 5, and their pass band characteristics are shown in FIGS. 44 to 49.

In the sixth to the eleventh examples, substrates 10 are 45° or 43° Y rotated X cut lithium tetraborate single crystal substrates, and a propagation direction of surface acoustic waves is the Z axis direction. Interdigital transducers 21, 22, 23, 31, 32, 33 are of the so-called normal type whose finger electrodes are alternately formed over substantially the same length. An aperture length of the interdigital transducers 21, 22, 23, 31, 32, 33 is 6.88 λ.

A frequency f is represented by a normalized frequency f/fo normalized by a center frequency fo of a pass band.

TABLE 5

Figure 44:
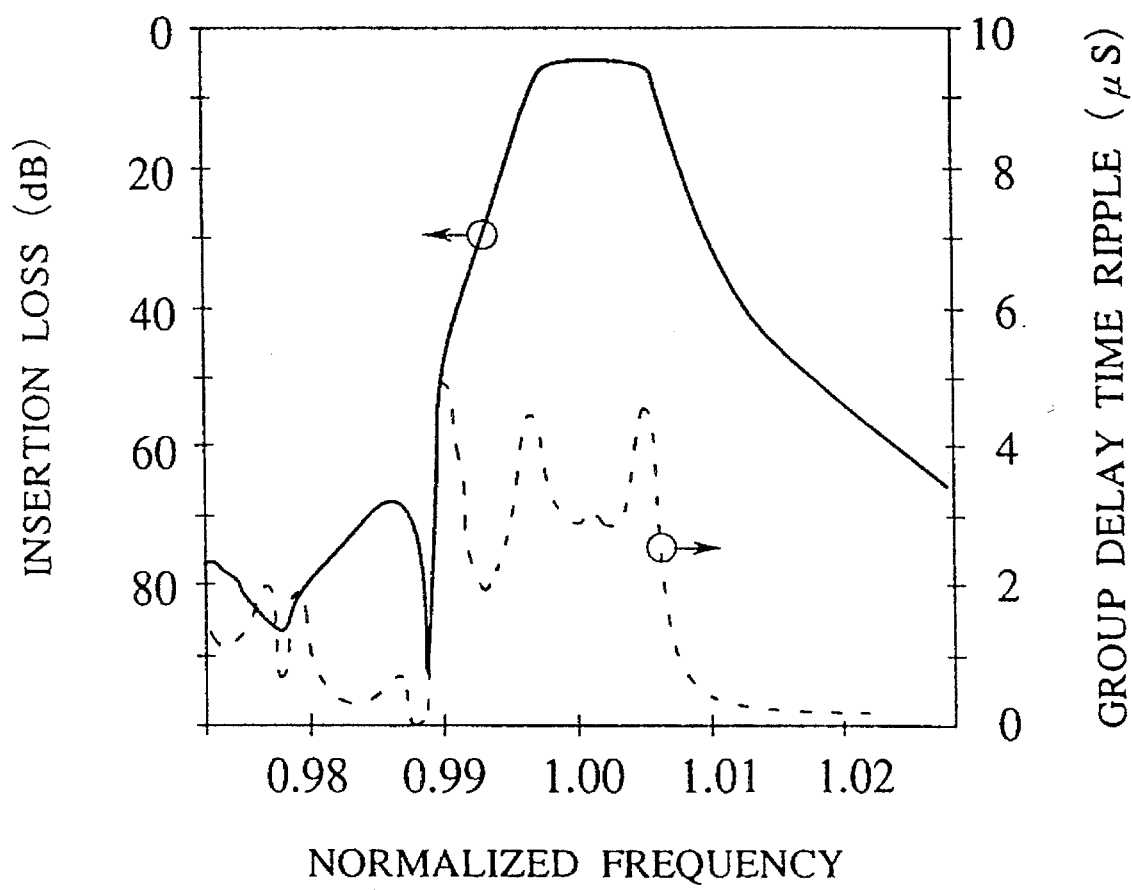
FIG. 44 is a graph of frequency response of insertion losses and group delay times in the surface acoustic wave filter according to a sixth example of the present invention.
Figure 45:
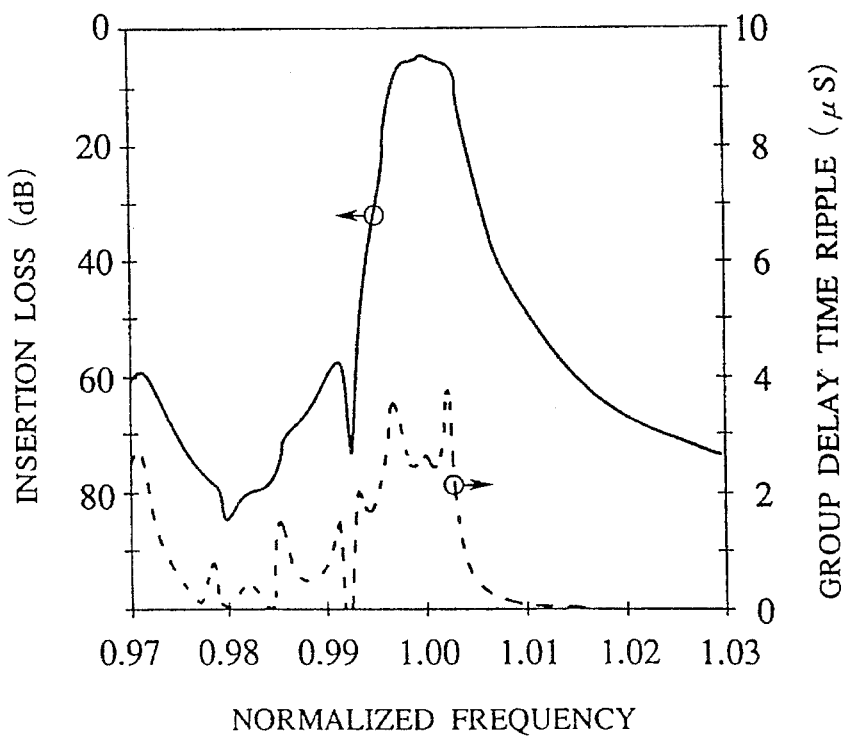
FIG. 45 is a graph of frequency response of insertion losses and group delay times in the surface acoustic wave filter according to a seventh example of the present invention.
Figure 46:
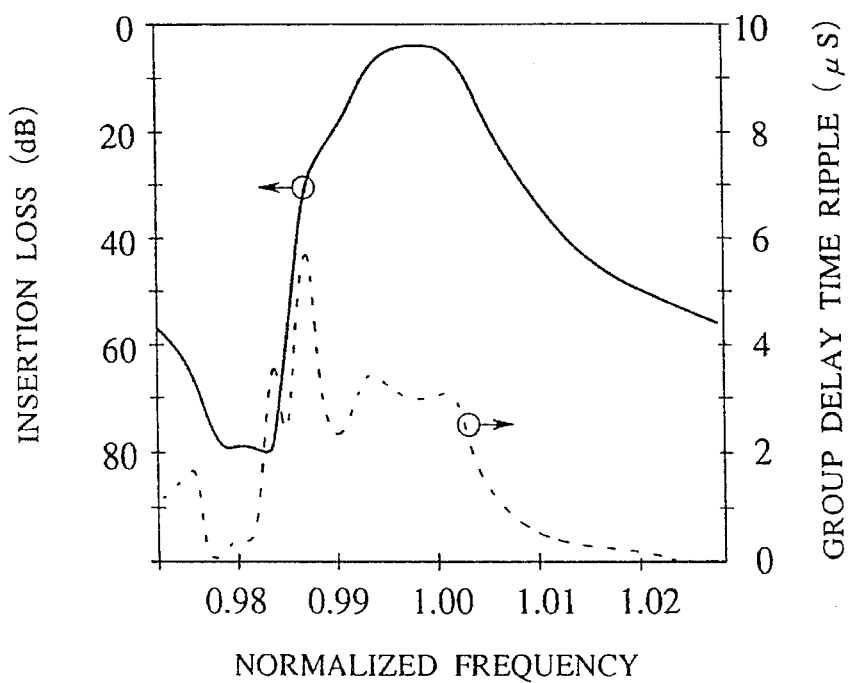
FIG. 46 is a graph of frequency response of insertion losses and group delay times in the surface acoustic wave filter according to an eighth example of the present invention.
Figure 47:
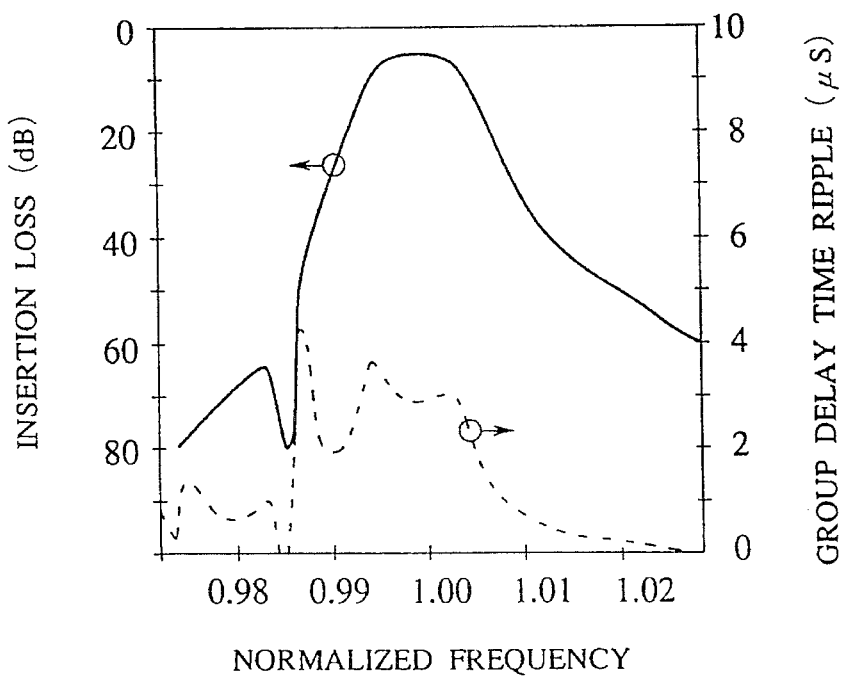
FIG. 47 is a graph of frequency response of insertion losses and group delay times in the surface acoustic wave filter according to a ninth example of the present invention.
Figure 48:
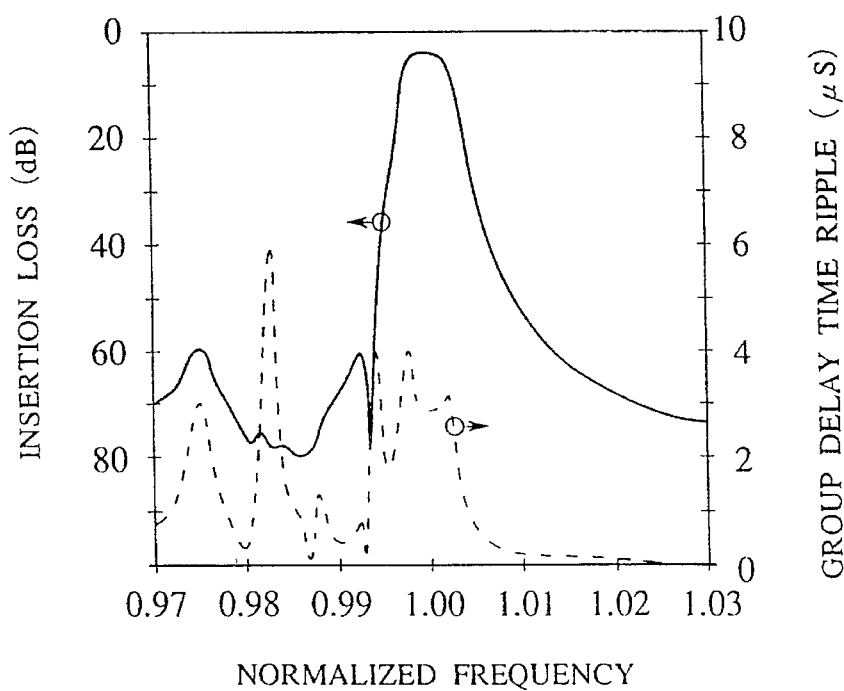
FIG. 48 is a graph of frequency response of insertion losses and group delay times in the surface acoustic wave filter according to a tenth example of the present invention.
Figure 49:
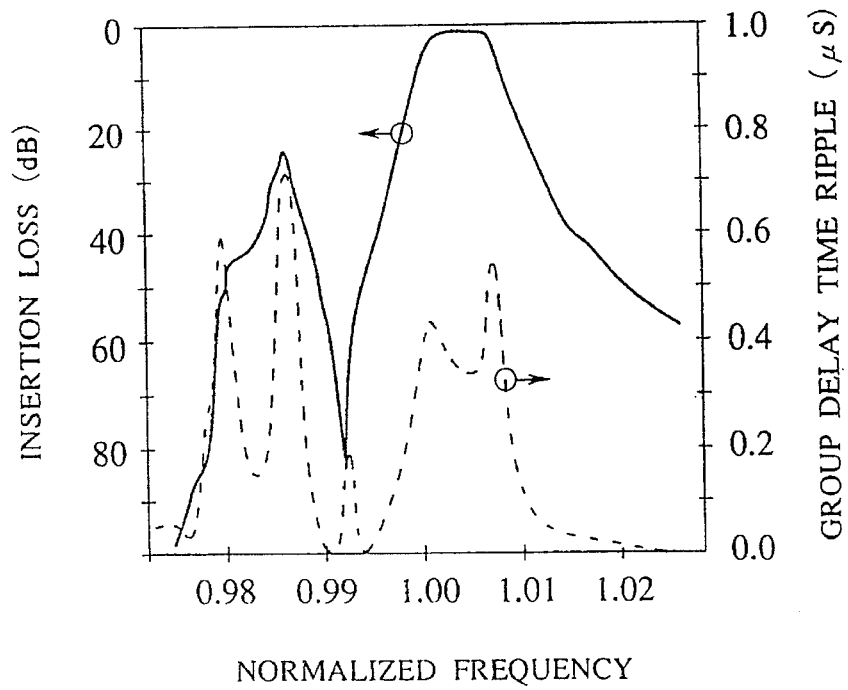
FIG. 49 is a graph of frequency response of insertion losses and group delay times in the surface acoustic wave filter according to an eleventh example of the present invention.

| | Examples | | | | | |
|---|---|---|---|---|---|---|
| | 6 | 7 | 8 | 9 | 10 | 11 |
| Transducer structure | FIG. 2 | FIG. 2 | FIG. 3 | FIG. 3 | FIG. 3 | FIG. 4 |
| Normalized film thickness(%) | 1.68 | 2.41 | 0.89 | 1.67 | 2.41 | 1.67 |
| Number of central IDT pairs | 66.5 | 52.5 | 86 | 58 | 56.5 | 58 |
| Numbers of 1st & 2nd IDTs pairs | 44.5 | 32.5 | 78 | 40 | 36.5 | 40 |
| Total number of IDT pairs | 155.5 | 117.5 | 242 | 138 | 129.5 | 138 |
| Ratio of IDT pairs | 1.34 | 1.24 | 1.81 | 1.38 | 1.29 | 1.38 |
| IDT gap (λ) | 0.46 | 0.46 | 0.46 | 0.46 | 0.46 | 0.46 |
| Metallization ratio | 0.50 | 0.50 | 0.60 | 0.50 | 0.50 | 0.50 |
| Terminal impedance (Ω) | 520 + j230 | 520 + j230 | 330 + j150 | 550 + j300 | 520 + j230 | 520 |
| Frequency response | FIG. 44 | FIG. 45 | FIG. 46 | FIG. 47 | FIG. 48 | FIG. 49 |

The sixth example is the surface acoustic wave filter in the first connection form of FIG. 2 and provides the frequency response of FIG. 44. Good pass band characteristics of a 0.47% 3 dB specific band width, a 4 dB minimum insertion loss, a 0.5 dB amplitude ripple and a 2 μS group delay time ripple are obtained, and a good attenuation characteristic of a 60 dB outside the pass band is obtained.

The seventh example is the surface acoustic wave filter in the first connection form of FIG. 2 and provides the frequency response of FIG. 45. Good pass band characteristics of a 0.54% 3 dB specific band width, a 4 dB minimum insertion loss, a 0.5 dB amplitude ripple and a 2 μS group delay time ripple are obtained, and a good attenuation characteristic of a 60 dB outside the pass band is obtained.

The eighth example is the surface acoustic wave filter in the second connection form of FIG. 3 and provides the frequency response of FIG. 46. Good pass band characteristics of a 0.39% 3 dB specific band width, a 4 dB minimum insertion loss, a 0 dB amplitude ripple (because of single peak characteristic) and a 0.8 μS group delay time ripple are obtained, and a 48 dB attenuation outside the pass band is obtained.

The ninth example is the surface acoustic wave filter in the second connection form of FIG. 3 and provides the frequency response of FIG. 47. Good pass band characteristics of a 0.4% 3 dB specific band width, a 4 dB minimum insertion loss, a 0 dB amplitude ripple (because of single peak characteristic) and a 1 μS group delay time ripple are obtained, and a good attenuation characteristic of 60 dB outside the pass band is obtained.

The tenth example is the surface acoustic wave filter in the second connection form of FIG. 3 and provides the frequency response of FIG. 48. Good pass band characteristics of a 0.43% 3 dB specific band width, a 4 dB minimum insertion loss, a 0 dB amplitude ripple (because of single peak characteristic) and a 1.3 μS group delay time ripple are obtained, and a good attenuation characteristic of 58 dB outside the pass band is obtained.

The surface acoustic wave filters in the first and second connection forms have a good shape factor. Especially, the surface acoustic wave filter in the first connection form is preferable because of a better shape factor.

Figure 50:
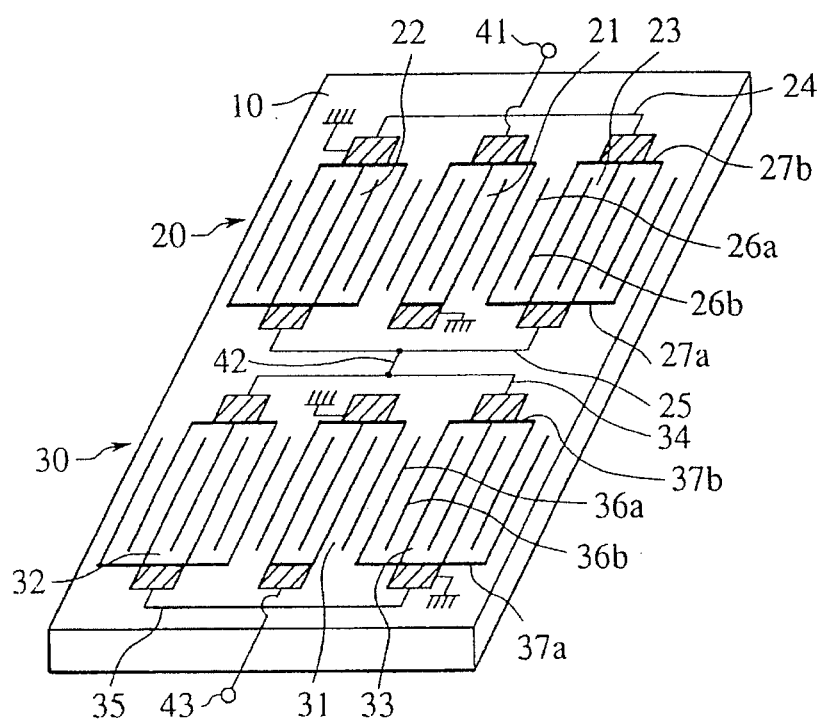
FIG. 50 is a view of the second embodiment of the transducer structure of the surface acoustic wave device according to the present invention in an alternative version of the second connection form.

Another transducer structure of the surface acoustic wave filter in the second connection form is exemplified in FIG. 50. A difference of this structure from that of FIG. 3 is that a first and a second interdigital transducers 22, 23 of a first row of transducers 20 are connected in parallel respectively by wires 24, 25, and a first and a second interdigital transducers 32, 33 of a second row of transducers 30 are connected in cascade respectively by wires 34, 35, and the wires 25, 34 are interconnected by a cascade connection wire 42. This transducer structure can provide frequency response equivalent to those of examples 8 to 10.

The eleventh example is the surface acoustic wave filter in the third connection form of FIG. 4 and provides the frequency response of FIG. 49. Good pass band characteristics of a 0.4% 3 dB specific band width, a 4 dB minimum insertion loss, a 0.5 dB amplitude ripple and a 2 μS group delay time ripple are obtained.

As evident in the above-described examples, the surface acoustic wave filter according to the present invention can provide, as a filter especially for the digital communication, good characteristics.

The present invention covers variations and modifications other than the above.

For example, the above-described examples may have in the transducer structures additional plural transducers connected in cascade.

As a material of the interdigital transducers, copper, silicon or others may be added to aluminum, and other conducting materials may be used.

The interdigital transducers may be essentially formed not by a lift-off process, but may be patterned by etching.

The first and the second interdigital transducers are usually disposed adjacent to the central interdigital transducer in an equal number on both sides of the central interdigital transducer, but may be provided in slightly different numbers.

The wires and the cascade connection wires may be formed of aluminium film patterns, but may be formed of metal strips or other electrical conducting means.

Thus, the present invention can provide a surface acoustic wave filter which is suitably used especially in digital communication because of its flat group delay time and small insertion losses in a pass band, and relatively wide specific band width, and large attenuation.

What is claimed is:

1. A surface acoustic wave device comprising:
    a lithium tetraborate substrate;
    a first row of transducers including a central interdigital transducer disposed on the substrate, and a first interdigital transducer and a second transducer disposed on both sides of the central transducer adjacent thereto; and
    a second row of transducers including a central interdigital transducer disposed on the substrate, and a first interdigital transducer and a second transducer disposed on both sides of the central transducer adjacent thereto, the second row of transducers being connected in cascade to the first row of transducers;
    wherein the central interdigital transducer of the first row of transducers, and the first and the second interdigital transducers of the second row of transducers are respectively connected to an input terminal and an output terminal;
    the first and the second interdigital transducers of the first row of transducers are connected to the central interdigital transducer of the second row of transducers; and
    the first and the second interdigital transducers of the first row of transducers are connected to the central interdigital transducer of the second row of transducers; and
    a sum Nc+Ns of a number of the central interdigital transducer pairs Nc, and a total number of the first and the second interdigital transducers pairs Ns of each row satisfies the following formula $$210-6000H/\lambda \leq Nc+Ns \leq 320-3000H/\lambda.$$

2. A surface acoustic wave device according to claim 1, wherein
    a ratio Ns/Nc of a total number of the first and the second interdigital transducers pairs Ns to a number of the central interdigital transducer pairs Nc satisfies the following formula $$1.0 \leq Ns/Nc \leq 1.6 \text{ or } 2.5 \leq Ns/Nc \leq 3.1.$$

3. A surface acoustic wave device according to claim 1 wherein
    the sum Nc+Ns of the numbers of each row satisfies the following formula $$220-6000H/\lambda \leq Nc+Ns \leq 320-6000H/\lambda.$$

4. A surface acoustic wave device according to claim 1, wherein
    in each row of transducers, a distance Li between a center of an outermost finger electrode of the central interdigital transducer and a center of a outermost finger electrode of the first or the second interdigital transducers satisfies the following formula $$0.40\lambda + n\lambda \leq Li \leq 0.54\lambda + n\lambda$$

where n is a positive integer or zero.

5. A surface acoustic wave device according to claim 3, wherein
    a ratio Ns/Nc of a total number of the first and the second interdigital transducers pairs Ns to a number of the central interdigital transducer pairs Nc satisfies the following formula $$1.0 \leq Ns/Nc \leq 1.6 \text{ or } 2.5 \leq Ns/Nc \leq 3.1.$$

6. A surface acoustic wave device according to claim 2, wherein in each row of transducers, a distance Li between a center of an outermost finger electrode of the central interdigital transducer and a center of a outermost finger electrode of the first or the second interdigital transducers satisfies the following formula $$0.40\lambda + n\lambda \leq Li \leq 0.54\lambda + n\lambda$$

where n is a positive integer or zero.

7. A surface acoustic wave device according to claim 2, wherein the distance Li between the centers of the finger electrodes satisfies the following formula $$0.43\lambda + n\lambda \leq Li \leq 0.47\lambda + n\lambda.$$

8. A surface acoustic wave device according to claim 5, wherein the distance Li between the centers of the finger electrodes satisfies the following formula $$0.43\lambda + n\lambda \leq Li \leq 0.47\lambda + n\lambda.$$

9. A surface acoustic wave device according to claim 1, wherein a metallization ratio which indicates a ratio of the substrate occupied by the finger electrodes of the interdigital transducers in a propagation direction of surface acoustic waves is above 0.50 and below 0.75.

10. A surface acoustic wave device according to claim 3, wherein a metallization ratio which indicates a ratio of the substrate occupied by the finger electrodes of the interdigital transducers in a propagation direction of surface acoustic waves is above 0.50 and below 0.75.

11. A surface acoustic wave device according to claim 1, wherein the interdigital transducers are formed of aluminium as a main component; and the normalized film thickness is above 0.005 and below 0.03.

12. A surface acoustic wave device according to claim 3, wherein the interdigital transducers are formed of aluminium as a main component; and the normalized film thickness is above 0.005 and below 0.03.

13. A surface acoustic wave device according to claim 1, wherein a cut angle of the substrate and a propagation direction of surface acoustic waves are in an Eulerian angle representation of (0°–45°, 90°±10°, 90°±10°) and directions equivalent thereto.

14. A surface acoustic wave device according to claim 3, wherein a cut angle of the substrate and a propagation direction of surface acoustic waves are in an Eulerian angle representation of (0°–45°, 90°±10°, 90°±10°) and directions equivalent thereto.

15. A surface acoustic wave device according to claim 2, wherein a cut angle of the substrate and a propagation direction of surface acoustic waves are in an Eulerian angle representation of (0°–45°, 90°±10°, 90°±10°) and directions equivalent thereto.

16. A surface acoustic wave device according to claim 11, wherein a cut angle of the substrate and a propagation direction of surface acoustic waves are in an Eulerian angle representation of (0°–45°, 90°±10°, 90°±10°) and directions equivalent thereto.

17. A surface acoustic wave device according to claim 13, wherein a cut angle of the substrate and a propagation direction of surface acoustic waves are in an Eulerian angle representation of (45°±5°, 90°±5°, 90°±5°) and directions equivalent thereto.

18. A surface acoustic wave device according to claim 14, wherein a cut angle of the substrate and a propagation direction of surface acoustic waves are in an Eulerian angle representation of (45°±5°, 90°±5°, 90°±5°) and directions equivalent thereto.

19. A surface acoustic wave device according to claim 5, wherein in each row of transducers, a distance Li between a center of an outermost finger electrode of the central interdigital transducer and a center of a outermost finger electrode of the first or the second interdigital transducers satisfies the following formula $$0.40\lambda + n\lambda \leq Li \leq 0.54\lambda + n\lambda$$

wherein n is a positive integer or zero.

20. A surface acoustic wave device according to claim 3, wherein in each row of transducers, a distance Li between a center of an outermost finger electrode of the central interdigital transducer and a center of a outermost finger electrode of the first or the second interdigital transducers satisfies the following formula $$0.40\lambda + n\lambda \leq Li \leq 0.54\lambda + n\lambda$$

where n is a positive integer or zero.

* * * * *